(12) United States Patent
Suzuki

(10) Patent No.: US 7,659,758 B2
(45) Date of Patent: Feb. 9, 2010

(54) RESET CIRCUIT AND SYSTEM HAVING RESET CIRCUIT

(75) Inventor: Hideaki Suzuki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 179 days.

(21) Appl. No.: 11/984,908

(22) Filed: Nov. 26, 2007

(65) Prior Publication Data

US 2008/0122500 A1     May 29, 2008

(30) Foreign Application Priority Data

Nov. 27, 2006    (JP)    ............................. 2006-318449
Mar. 7, 2007    (JP)    ............................. 2007-057225

(51) Int. Cl.
*H03L 7/00*     (2006.01)

(52) U.S. Cl. ...................................... 327/143; 327/198

(58) Field of Classification Search ................. 327/142, 327/143, 198
See application file for complete search history.

(56) References Cited

U.S. PATENT DOCUMENTS 7,425,854 B2 * 9/2008 Suzuki ....................... 327/198
7,545,186 B2 * 6/2009 Suzuki et al. ............... 327/143
2005/0275437 A1 12/2005 Suzuki et al.
2007/0159222 A1 * 7/2007 Ogai et al. .................. 327/143

* cited by examiner

*Primary Examiner*—Lincoln Donovan
*Assistant Examiner*—Patrick O'Neill
(74) *Attorney, Agent, or Firm*—Arent Fox LLP

(57) ABSTRACT

In a power-on detection circuit, a first connection node at which a first divided voltage is generated is connected to a second power supply line during activation of a power-down detection signal. Inactivation timing of the power-down detection signal is set earlier than an activation timing of a power-on detection signal. Therefore, the first transistor whose gate is connected to the first connection node is certainly turned off in the first half of a power-on period, which prevents the power-on detection signal from being activated during the power-on period. Further, a leak current flowing through the first transistor is reduced. In the second half of the power-on period, the power-on detection signal is certainly generated using the first divided voltage generated by the first dividing circuit. Thus, operating a reset circuit without malfunction and normally outputting a reset signal is possible disregarding behavior of a power supply voltage at power-on.

13 Claims, 32 Drawing Sheets

RESET CIRCUIT AND SYSTEM HAVING RESET CIRCUIT

CROSS REFERENCE TO RELATED APPLICATION

This application is based upon and claims the benefit of priority from Japanese Patent Application No. 2006-318449, filed on Nov. 27, 2006, and Japanese Patent Application No. 2007-057225, filed on Mar. 7, 2007, the entire contents of which are incorporated herein by reference.

TECHNICAL FIELD

The present invention relates to a reset circuit which detects power-on or power-down of a device and outputs a reset signal.

BACKGROUND

A semiconductor device such as a memory or a logic requires a reset signal generated in response to power-on in order to initialize a circuit such as a latch at the power-on. Recently, this kind of semiconductor device is sometimes mounted in a sub system apparatus having a so-called hot-swap function of being attachable to and detachable from a main system apparatus in a power-on state. In this case, the reset signal needs to be generated in response to not only power-on but also power-down in order to protect an internal state of the semiconductor device or reset an internal circuit when the sub system apparatus is detached from the main system apparatus.

Generally, a reset circuit which outputs a reset signal in response to power-on and power-down includes a detection circuit detecting a change in power supply voltage and an output circuit outputting the reset signal according to a detection result of the detection circuit. For example, the detection circuit includes a dividing circuit dividing the power supply voltage, a transistor (inverter) receiving a divided voltage at its gate, a load circuit charging a drain node of the transistor, and a buffer circuit outputting a power-on detection signal according to a drain voltage of the transistor. The output circuit includes a latch brining the level of the reset signal into a reset state or a reset release state according to the level of the power-on detection signal (for example, FIG. 2, FIG. 3 of U.S. Patent Publication No. 2005-0275437).

In the above detection circuit, the drain node of the transistor is charged via the load circuit at power-on. By this charge, the power-on detection signal is held in the reset state immediately after the power-on. When the divided voltage exceeds a threshold voltage of the transistor, the transistor is turned on, the level of the drain node is inverted, and the level of the power-on detection signal changes from the reset state to the reset release state.

However, when the power supply voltage increases slowly or the power supply voltage swings at power-on, the dividing circuit sometimes cannot output a normal voltage. In this case, before being fully charged, the drain node changes to a ground voltage by the transistor being turned on. At this time, the level of the power-on detection signal changes to the reset release state after being set to the reset state only for a short time. Alternatively, the level of the power-on detection signal is set to the reset release state without being set to the reset state. As a result, there arises a problem that the circuit such as the latch cannot be reset at power-on. This problem tends to occur when a balance between threshold voltages of a pMOS transistor and an nMOS transistor is lost by a change in semiconductor process. Further, generally, the load circuit is constituted of a pMOS transistor with a small drivability or the like and functions as a high-resistance resistor in many cases. Therefore, if the above transistor functioning as the inverter is slightly turned on, the drain node changes to the ground voltage.

Furthermore, a starter circuit which initializes the detection circuit of the reset circuit at power-on or power-down is sometimes formed in the reset circuit. The starter circuit includes a capacitor to which the power supply voltage is applied. The capacitor always receives the power supply voltage while the system apparatus is operating. Generally, the capacitor may cause a reliability failure due to degradation called TDDB (Time-Dependent Dielectric-Breakdown). The TDDB degradation tends to occur more frequently as the voltage value applied to the capacitor becomes larger and as the application time becomes longer. If the capacitor of the starter circuit degrades due to TDDB and a leak current occurs, the reset circuit becomes unable to detect the power supply voltage. Consequently, a circuit which requires reset at power-on or power-off cannot be reset, which causes the semiconductor device and the system apparatus to malfunction. In other words, there is a possibility that the lives of the semiconductor device and the system apparatus become shorter due to the reliability failure of the capacitor used in the reset circuit.

SUMMARY

In one aspect of the present invention, a reset circuit has a power-on detection circuit, a power-down detection circuit, and a power detection control circuit. The power-on detection circuit includes a first dividing circuit, a first transistor, a clamping switch, a first load circuit, and a first buffer circuit. The power detection control circuit activates a reset signal in response to activation of a power-on detection signal from the power-on detection circuit and inactivates the reset signal in response to activation of a power-down detection signal from the power-down detection circuit.

The first dividing circuit includes at least two first resistor elements disposed in series between a first power supply line and a second power supply line and generates a first divided voltage at a first connection node connecting the first resistor elements to each other. The first transistor receives the first divided voltage at its gate and its source is connected to the second power supply line. The clamping switch is turned on during the activation of the power-down detection signal to connect the gate of the first transistor to the second power supply line. The first load circuit charges a first output node connected to a drain of the first transistor using a resistor element disposed between the first power supply line and the first output node. The first buffer circuit shapes a voltage waveform of the first output node and outputs it as the power-on detection signal. The power-on detection circuit activates the power-on detection signal by the first transistor being turned on when a power supply voltage exceeds a first voltage.

The power-down detection circuit includes a second dividing circuit, a second transistor, a second load circuit, and a second buffer circuit. The second dividing circuit includes at least two second resistor elements disposed in series between the first power supply line and the second power supply line and a connection switch disconnecting the second resistor element and the second power supply line during inactivation of the power-on detection signal. The second dividing circuit generates a second divided voltage at a second connection node connecting the second resistor elements to each other during a power hold period when the power-on detection signal is activated. Further, the second dividing circuit operates as a load circuit and generates a voltage following the power supply voltage at the second connection node during a power-on period when the power-on detection signal is inactivated. The second transistor receives the second divided voltage at its gate and its source is connected to the second power supply line. The second load circuit charges a second output node connected to a drain of the second transistor using a resistor element disposed between the first power supply line and the second output node. The second buffer circuit shapes a voltage waveform of the second output node and outputs it as the power-down detection signal.

The power-down detection circuit activates the power-down detection signal when the power supply voltage becomes lower than a second voltage lower than the first voltage. Further, in the power-on period during which the power supply voltage increases, the second dividing circuit operates as a load circuit which charges the second connection node. Therefore, the voltage of the second connection node increases earlier than the voltage of the first connection node of the power-on detection circuit. The second transistor is turned on earlier than the first transistor, and an inactivation timing of the power-down detection signal becomes earlier than an activation timing of the power-on detection signal. Hence, in a first half of the power-on period, the first connection node can be certainly clamped to the voltage of the second power supply line using the power-down detection signal in an inactivation state. The voltage of the first connection node can be prevented from being elevated during the power-on period, which can prevent the power-on detection signal from being activated during the power-on period. More specifically, the reset signal can be certainly held at a reset level during the power-on period, which can prevent a problem that an internal circuit of a system cannot be initialized. The first transistor can be certainly turned off in the first half of the power-on period, so that a leak current between the source and the drain of the first transistor can be reduced. Further, the first transistor is turned off in response to the activation of the power-down detection signal when the supply of the power supply voltage is stopped. Hence, the first connection node of the power-on detection circuit can be certainly reset at power-down.

For example, by disposing a leak prevention switch which is turned off during the activation of the power-down detection signal between the first connection node of the first dividing circuit and the first transistor, the leak current can be prevented from flowing between the first power supply line and the second power supply line via the first dividing circuit and the clamping switch while the clamping switch is on. The leak prevention switch may be provided on the first power supply line side of the first dividing circuit. In this case, the first resistor element may be constituted of a transistor and used as the leak prevention switch. The reset circuit is implemented, for example, in any of semiconductor devices constituting a system. Alternatively, a system is constituted of a main system apparatus and a sub system apparatus which is detachably connected to the main system apparatus and to which a power supply is supplied from the main system apparatus, and the reset circuit is implemented in any of semiconductor devices constituting the sub system apparatus.

In another aspect of the present invention, a power detection circuit activates a power-on signal indicating a power-on state when a power supply voltage exceeds a first voltage and is initialized during activation of an initializing signal. A starter circuit includes a resistor element, a cut-off switch, and a capacitor disposed in series between a power supply line and a ground line and outputs the initializing signal from a first connection node connecting the resistor element and the cut-off switch. The cut-off switch is turned off during the activation of the power-on signal. This can prevent the capacitor from being charged via the resistor element during the power-on state. The period in the power-on state is a dominant period during which the semiconductor device and the system apparatus are operating. As a result, TDDB degradation of the capacitor can be certainly prevented, which can prevent the semiconductor device in which the reset circuit is implemented and the system from malfunctioning.

DETAILED DESCRIPTION OF THE EMBODIMENTS

Figure 1:
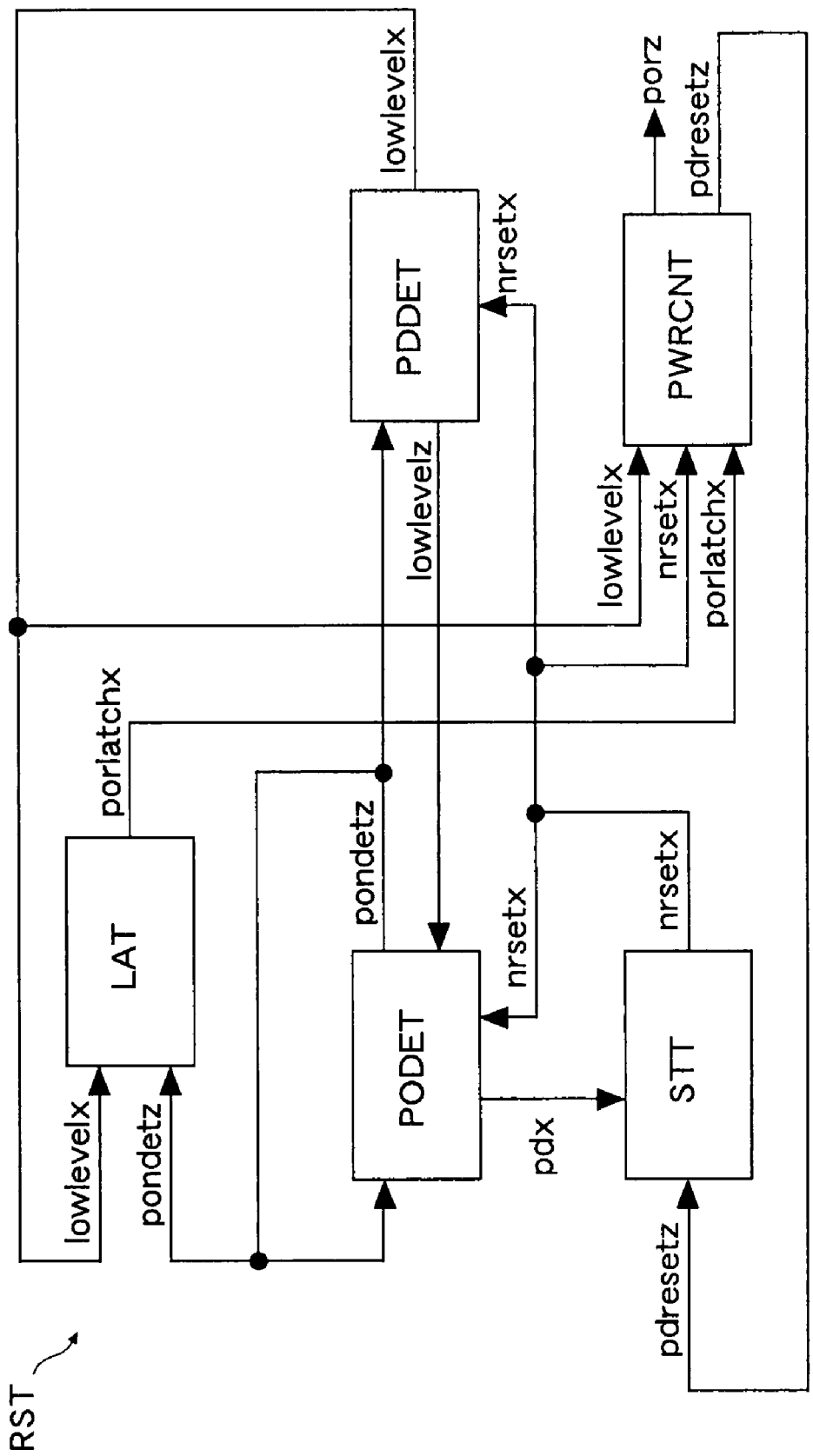
FIG. 1 is a block diagram showing a reset circuit of a first embodiment of the present invention.

Hereinafter, embodiments of the present invention will be described, using the drawings. In the drawings, each signal line through which the signal is transmitted is denoted by the same reference symbol as the signal name. Each signal ending with "z" represents positive logic. Each signal ending with "x" represents negative logic.

FIG. 1 shows a reset circuit RST of a first embodiment of the present invention. The reset circuit RST is implemented, for example, in a semiconductor device such as a ferroelectric memory. The reset circuit RST detects an increase and a decrease in power supply voltage supplied to the semiconductor device and outputs a reset signal porz. Namely, the reset circuit RST has a power-on detection function and a power-down detection function. In the following description, a period from when the supply of the power supply voltage to the semiconductor device is started until when the power supply voltage exceeds a predetermined voltage (first voltage V1) is called a power-on period POP. A period during which the supply of the power supply voltage to the semiconductor device is stopped and the power supply voltage is lower than a predetermined voltage (second voltage V2) is called a power-down period PDP. A period until the power supply voltage becomes lower than the second voltage V2 after exceeding the first voltage V1 is called a power hold period PHP. The power hold period PHP is a period during which the semiconductor device is operating on a system.

The reset circuit RST includes a power-on detection circuit PODET, a power-down detection circuit PDDET, a latch circuit LAT, a power detection control circuit PWRCNT, and a starter circuit STT. The power-on detection circuit PODET activates a power-on detection signal pondetz to a high level when the power supply voltage supplied to the semiconductor device exceeds the first voltage V1. The power-down detection circuit PDDET temporarily activates a power-down detection signal lowlevelx to a low level when the power supply voltage becomes lower than the second voltage V2 lower than the first voltage V1. Further, the power-down detection-circuit PDDET holds the power-down detection signal lowlevelx at the low level for a predetermined period from power-on, and thereafter inactivates the power-down detection signal lowlevelx to a high level before the power-on detection signal pondetz is activated. The power-down detection circuit PDDET outputs a power-down detection signal lowlevelz obtained by inverting the level of the power-down detection signal lowlevelx to the power-on detection circuit PODET.

The latch circuit LAT is reset during the activation (during the low level) of the power-down detection signal lowlevelx, and resets a latch signal porlatchx to a high level. The latch circuit LAT sets the latch signal porlatchx to a low level in response to the activation (rising edge) of the power-on detection signal pondetz during the inactivation of the power-down detection signal lowlevelx. The high level of the latch signal porlatchx indicates that the power supply voltage is in a power-on process or a power-down process. The low level of the latch signal porlatchx indicates that the power supply voltage is a normal value capable of operating the semiconductor device.

The power detection control circuit PWRCNT activates the reset signal porz to a high level in response to the activation of the power-on detection signal pondetz at power-on, and inactivates the reset signal porz to a low level in response to the activation of the power-down detection signal lowlevelx at power-down. The reset signal porz is a signal to reset an internal circuit such as a latch formed in the semiconductor device. The internal circuit is reset during the inactivation of the reset signal porz. Further, the power detection control circuit PWRCNT temporarily activates a power-down reset signal pdresetz to a high level in synchronization with the activation of the power-down detection signal lowlevelx at power-down.

The starter circuit STT activates an initializing signal nrsetx to a low level at the beginning of power-on, and then sets the level of the initializing signal nrsetx to a level following the power supply voltage. Further, the starter circuit STT activates the initializing signal nrsetx to the low level in synchronization with the activation of the power-down reset signal pdresetz at power-down.

Figure 2:
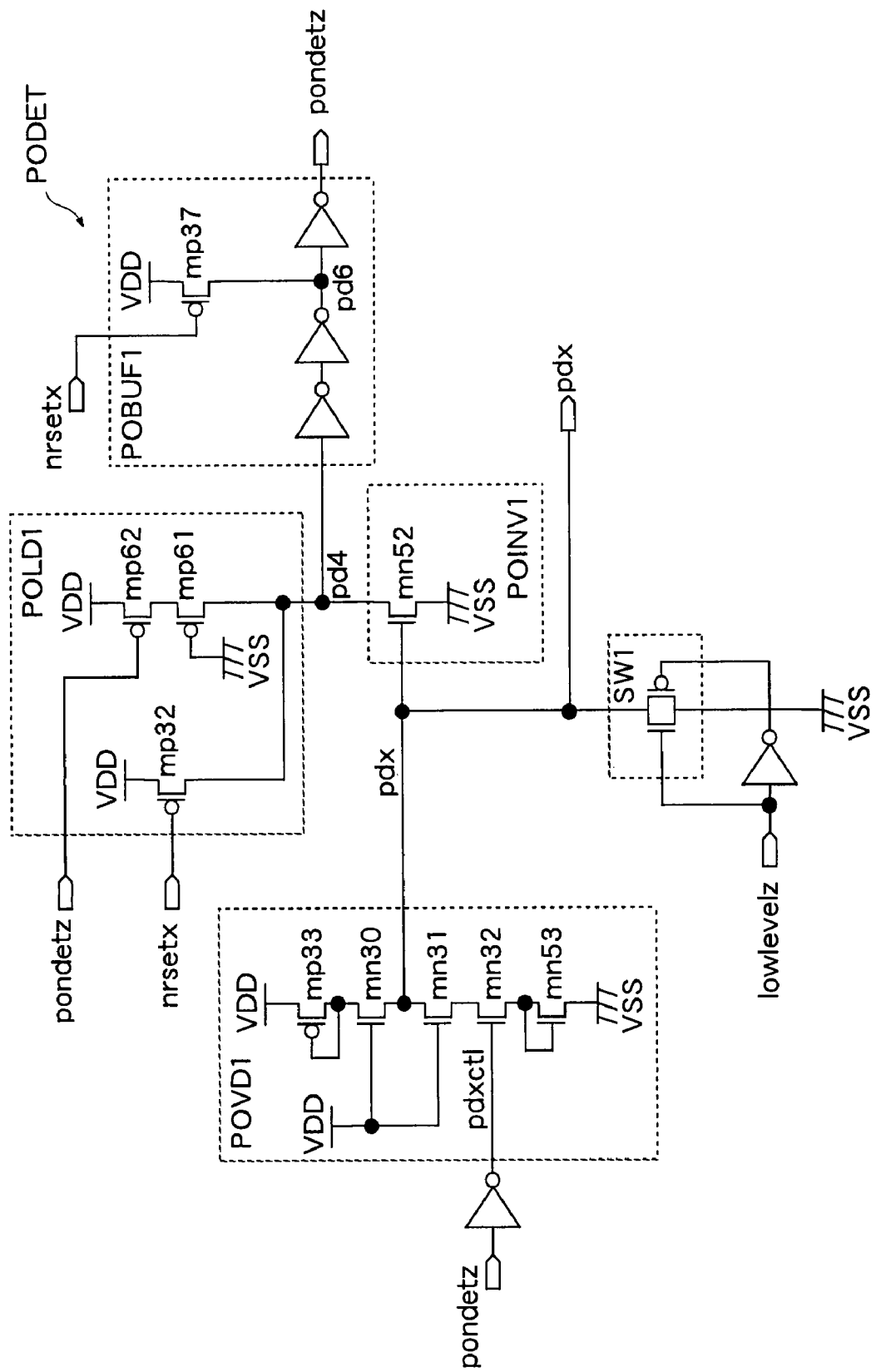
FIG. 2 is a circuit diagram showing details of a power-on detection circuit shown in FIG. 1.

FIG. 2 shows details of the power-on detection circuit PODET shown in FIG. 1. The power-on detection circuit PODET includes a first dividing circuit POVD1, a first load circuit POLD1, an inverter POINV1 constituted of an nMOS transistor mn52 (first transistor), a clamping switch SW1, and a first buffer circuit POBUF1.

The dividing circuit POVD1 includes a pMOS transistor mp33 and nMOS transistors mn30, mn31, mn32, mn53 connected in series between a power supply line VDD (first power supply line) and a ground line VSS (second power supply line). The transistors mp33, mn53 are diode-connected, respectively. Gates of the transistors mn30, mn31 are connected to the power supply line VDD, and the transistors mn30, mn31 operate as resistors (first resistor elements). A connection node pdx (first connection node) connecting the transistors mn30, mn31 to each other is connected to a gate of the transistor mn52. A gate of the transistor mn32 receives a signal pdxct1 obtained by inverting the logic level of the power-on detection signal pondetz.

The transistor mn32 of the dividing circuit POVD1 is turned on during the power-on period POP and the power-down period PDP when the power-on detection signal pondetz is inactivated and operates as a resistor (first resistor element). During these periods, a first divided voltage obtained by resistively dividing a power supply voltage VDD is generated at the node pdx. Further, the transistor mn32 of the dividing circuit POVD1 is turned off during the power hold period PHP when the power-on detection signal pondetz is activated. During this period, the node pdx is charged via the transistors mp33, mn30 and held at a high level. Namely, the dividing circuit POVD1 stops a dividing function during the power hold period PHP to operate as a load circuit which charges the node pdx. In the power hold period PHP, a current path from the power supply line VDD to the ground line VSS is cut off in the dividing circuit POVD1, leading to a reduction in current consumption.

The load circuit POLD1 includes pMOS transistors mp62, mp61 connected in series between the power supply line VDD and a first output node pd4 and a PMOS transistor mp32 disposed between the power supply line VDD and the first output node pd4. The transistor mp62 is turned on when receiving the low-level power-on detection signal pondetz at its gate. The transistor mp61 receives a ground voltage VSS at its gate and is always on. The transistor mp32 is turned on when receiving the low-level initializing signal nrsetx at its gate. The transistors mp61, mp62 operate as resistor elements to charge the node pd4 when the power-on detection signal pondetz is at the low level.

The transistor mn52 of the inverter POINV1 connects the node pd4 to the ground line VSS when the first divided voltage which is generated at the node pdx and received at its gate exceeds a threshold voltage of the transistor mn52. The clamping switch SW1 is constituted of a CMOS transmission gate, and during the activation of the power-down detection signal lowlevelz, it is turned on and connects the node pdx to the ground line VSS.

The buffer circuit POBUF1 includes three CMOS inverters connected in series and a pMOS transistor mp37 connected to an input node pd6 of the last inverter. When receiving the low-level initializing signal nrsetx, the transistor mp37 is turned on and connects the node pd6 to the power supply line VDD. During inactivation of the initializing signal nrsetx, the buffer circuit POBUF1 shapes a voltage waveform of the node pd4 received at its input, inverts it, and outputs it as the power-on detection signal pondetz. The transistor mp37 of the buffer circuit POBUF1 operates as a clamping circuit which fixes the power-on detection signal pondetz to the low level during the activation of the initializing signal nrsetx.

Figure 3:
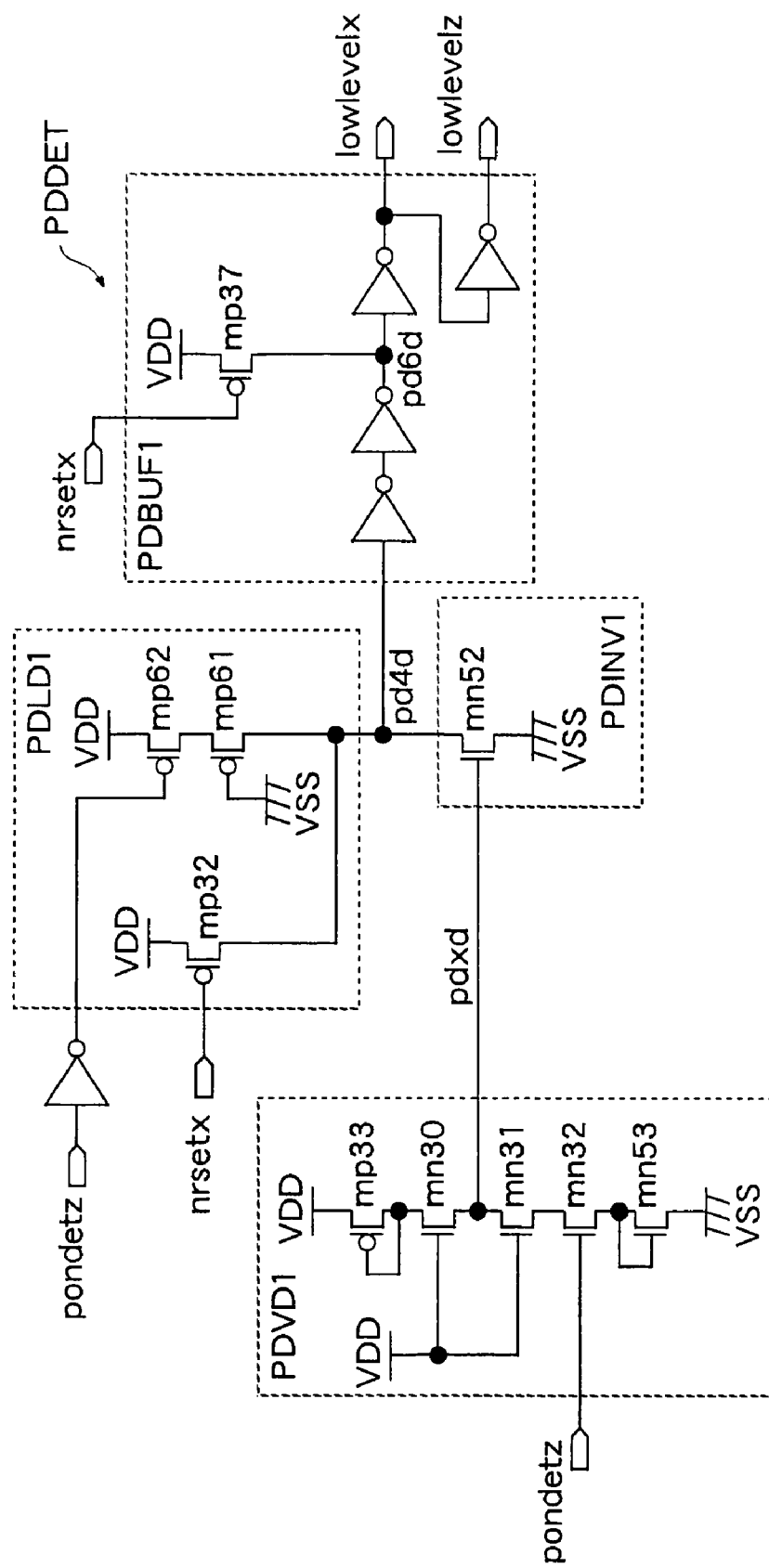
FIG. 3 is a circuit diagram showing details of a power-down detection circuit shown in FIG. 1.

FIG. 3 shows details of the power-down detection circuit PDDET shown in FIG. 1. The power-down detection circuit PDDET is constituted by eliminating the switch SW1 from the power-on detection circuit PODET shown in FIG. 2. A second dividing circuit PDVD1, a second load circuit PDLD1, and an inverter PDINV1 have the same circuit constitutions as the first dividing circuit POVD1, the first load circuit POLD1, and the inverter POINV1. A second buffer circuit PDBUF1 is constituted by adding a CMOS inverter which inverts the level of the power-down detection signal lowlevelx and outputs the resultant signal as the power-down detection signal lowlevelz to the first buffer circuit POBUF1 shown in FIG. 2. Incidentally, the transistor mp37 of the second buffer circuit PDBUF1 operates as a clamping circuit which fixes the power-down detection signal lowlevelx to the low level during the activation of the initializing signal nrsetx.

The transistors mn30, mn31 of the dividing circuit PDVD1 operate as resistors (second resistor elements). In the dividing circuit PDVD1, a connection node pdxd (second connection node) which connects the transistors mn30, mn31 to each other is connected to a gate of the transistor mn52 of the inverter PDINV1. The transistor mn32 of the dividing circuit PDVD1 receives the power-on detection signal pondetz directly. The transistor mn32 operates as a connection switch which electrically connects the transistor mn31 and the ground line VSS during the activation of the power-on detection signal pondetz and disconnects the transistor mn31 and the ground line VSS during the inactivation of the power-on detection signal pondetz.

The transistor mn32 of the dividing circuit PDVD1 is turned on during the power hold period PDP when the power-on detection signal pondetz is activated. During this period, a second divided voltage obtained by resistively dividing the power supply voltage VDD is generated at the node pdxd. The power supply voltage VDD increases sufficiently during the power hold period PHP. Therefore, the transistor mn52 is tuned on upon receiving a high-level node voltage pdxd.

Further, the transistor mn32 of the dividing circuit PDVD1 is turned off during the power-on period POP and the power-down period PDP when the power-on detection signal pondetz is inactivated. During these periods, the node pdxd is charged via the transistors mp33, mn30 and held at the high level. Namely, during the power-on period POP and the power-down period PDP, the dividing circuit PDVD1 stops the dividing function and operates as a load circuit which charges the node pdxd. In the dividing circuit PDVD1, a discharge path from the node pdxd to the ground line VSS is not formed during the power-on period POP or the power-down period PDP. Hence, during these periods, the voltage of the node pdxd becomes higher than the voltage of the node pdx of the power-on detection circuit PODET shown in FIG. 2. Therefore, when the power supply voltage VDD increases during the power-on period POP, the power-down detection circuit PDDET inactivates the power-down detection signal lowlevelx earlier than an activation timing of the power-on detection signal pondetz. Incidentally, in the power-on period POP and the power-down period PDP, the current path from the power supply line VDD to the ground line VSS is cut off in the dividing circuit PDVD1, leading to a reduction in current consumption.

The transistor mn62 of the load circuit PDLD1 receives the power-on detection signal pondetz via an inverter. The other constitutions are the same as those of the power-on detection circuit PODET. The transistor mp62 is turned on when receiving the high-level power-on detection signal pondetz at its gate. The transistors mp61, mp62 operate as resistor elements to charge a second output node pd4d when the power-on detection signal pondetz is at the high level. The load circuit PDLD1 sets the node pd4d to a high level when the power-on detection signal pondetz is at the high level or the initializing signal nrsetx is at the low level.

The transistor mn52 (second transistor) of the inverter PDINV1 connects the node pd4d to the ground line VSS when the second divided voltage which is generated at the node pdxd and received at its gate exceeds the threshold voltage of the transistor mn52.

During the inactivation of the initializing signal nrsetx, the buffer circuit PDBUF1 shapes a voltage waveform of the node pd4d received at its input, inverts it, and outputs it as the power-down detection signal lowlevelx. The transistor mp37 of the buffer circuit PDBUF1 operates as a clamping circuit which fixes the power-down detection signal lowlevelx to the low level during the activation of the initializing signal nrsetx.

Figure 4:
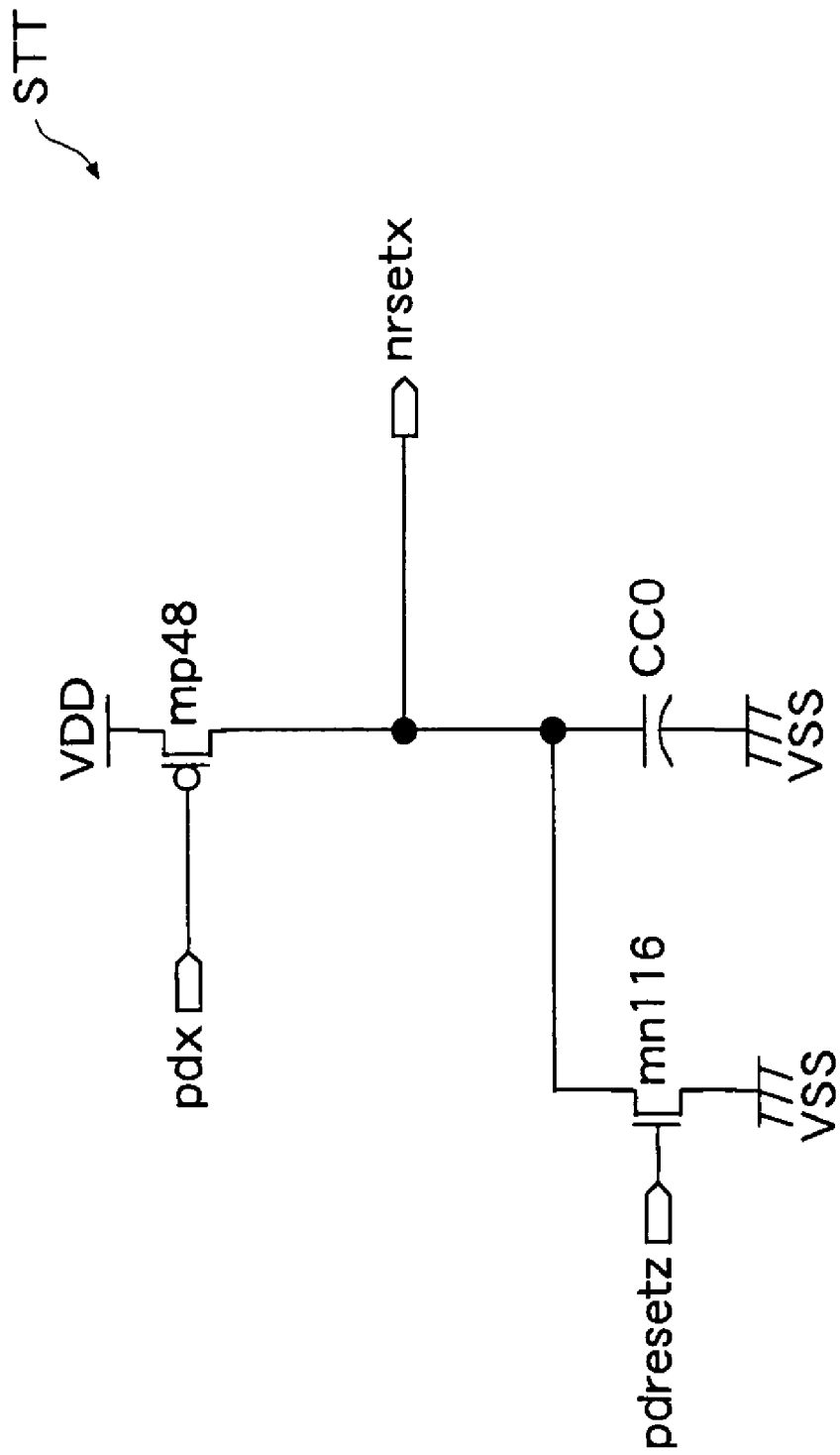
FIG. 4 is a circuit diagram showing details of a starter circuit shown in FIG. 1.

FIG. 4 shows details of the starter circuit STT shown in FIG. 1. The starter circuit STT includes a pMOS transistor mp48 and a capacitor CC1 connected in series between the power supply line VDD and the ground line VSS and an nMOS transistor mn116 connected between a drain of the transistor mp48 and the ground line VSS. A gate of the transistor mp48 is connected to the node pdx of the power-on detection circuit PODET. A gate of the transistor mn116 receives the power-down reset signal pdresetz. The starter circuit STT temporarily sets the initializing signal nrsetz to the low level along with the start of supply of the power supply voltage VDD, thereafter generates the initializing signal nrsetx having a voltage following the power supply voltage VDD during the inactivation of the power-down reset signal pdresetz, and fixes the initializing signal nrsetx to the low level during the activation of the power-down reset signal pdresetz.

Figure 5:
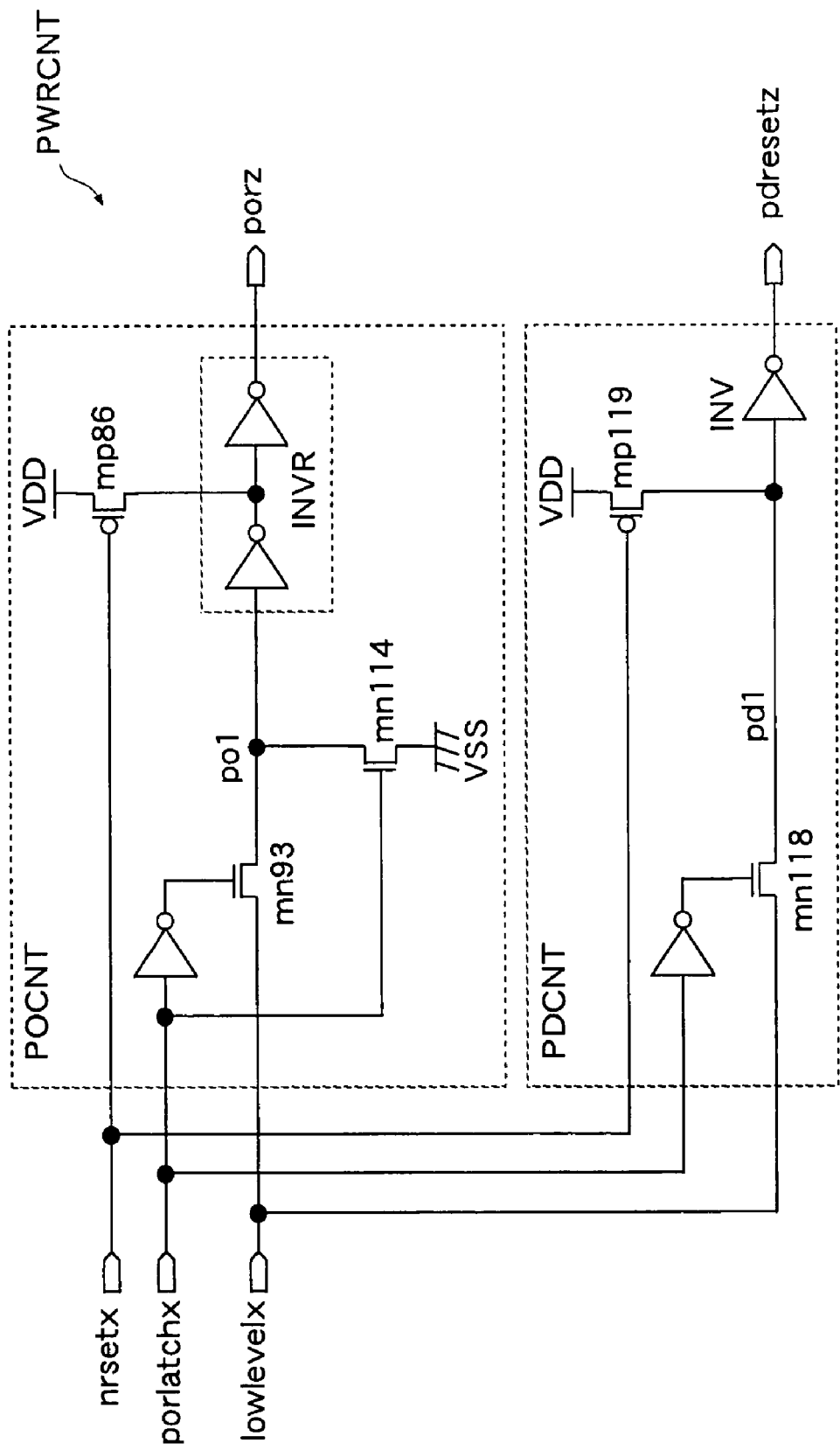
FIG. 5 is a circuit diagram showing details of a power detection control circuit shown in FIG. 1.

FIG. 5 shows details of the power detection control circuit PWRCNT shown in FIG. 1. The power detection control circuit PWRCNT includes a power-on control unit POCNT which generates the reset signal porz and a power-down control unit PDCNT which generates the power-down reset signal pdresetz.

The power-on control unit POCNT includes nMOS transistors mn93, mn114, a pMOS transistor mp86, and an inverter row INVR. The transistor mn93 is turned on and transmits the level of the power-down detection signal lowlevelx to a node po1 during the low level of the latch signal porlatchx. The transistor mn114 connects the node po1 to the ground line VSS during the high-level period of the latch signal porlatchx. The inverter row INVR is constituted of two CMOS inverters, receives the level of the node po1, and outputs the reset signal porz. The transistor mp86 is turned on during the low level of the initializing signal nrsetx in order to set the reset signal porz to the low level.

The power-down control unit PDNCT includes an nMOS transistor mn118, a pMOS transistor mp119, and a CMOS inverter INV operating as a buffer. The transistor mn118 is turned on and transmits the level of the power-down detection signal lowlevelx to a node pd1 during the low level of the latch signal porlatchx. The transistor mp119 is turned on during the low level of the initializing signal nrsetx in order to set the power-down reset signal pdresetz to the low level.

Figure 6:
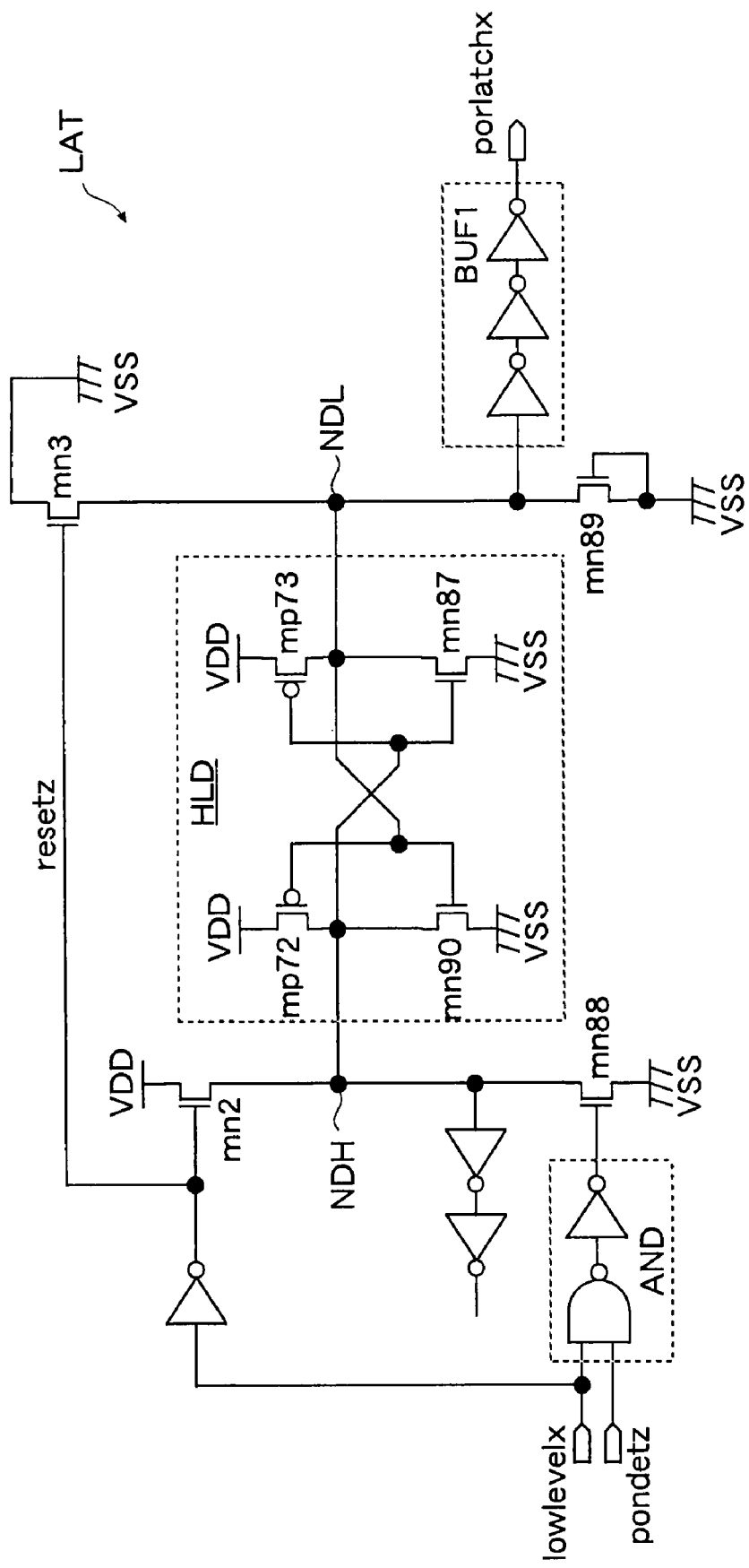
FIG. 6 is a circuit diagram showing details of a latch circuit shown in FIG. 1.

FIG. 6 shows details of the latch circuit LAT shown in FIG. 1. The latch circuit LAT includes a holding part HLD, an AND circuit AND, a buffer circuit BUF1, and nMOS transistors mn2, mn3, mn88, mn89 which control the operation of the holding part HLD. The holding part HLD is constituted by connecting an input and an output of a CMOS inverter constituted of a pMOS transistor mp72 and an nMOS transistor mn90 and an input and an output of a CMOS inverter constituted of a pMOS transistor mp73 and an nMOS transistor mn87 to each other. A reset signal resetz supplied to gates of the transistors mn2, mn3 is a signal obtained by inverting the power-down detection signal lowlevelx by an inverter. The holding part HLD holds a low level at a node NDL during the power-on period POP and the power-down period PDP, and holds a high level at the node NDL during the power hold period PHP.

The holding part HLD is initialized during the low-level period of the power-down detection signal lowlevelx and sets the nodes NDL, NDH to a low level and a high level, respectively. In this storage state, the latch circuit LAT outputs the high-level latch signal porlatchx. Further, the holding part HLD is set when receiving the high-level power-on detection signal pondetz during the high-level period of the power-down detection signal lowlevelx and sets the nodes NDL, NDH to a high level and a low level, respectively. In this storage state, the latch circuit LAT outputs the low-level latch signal porlatchx. A reset state of the latch circuit LAT (in which the porlatchx signal is at the high level) indicates the power-on period POP or the power-down period PDP. A set state of the latch circuit (in which the porlatchx signal is at the low level) indicates the power hold period PHP.

Figure 7:
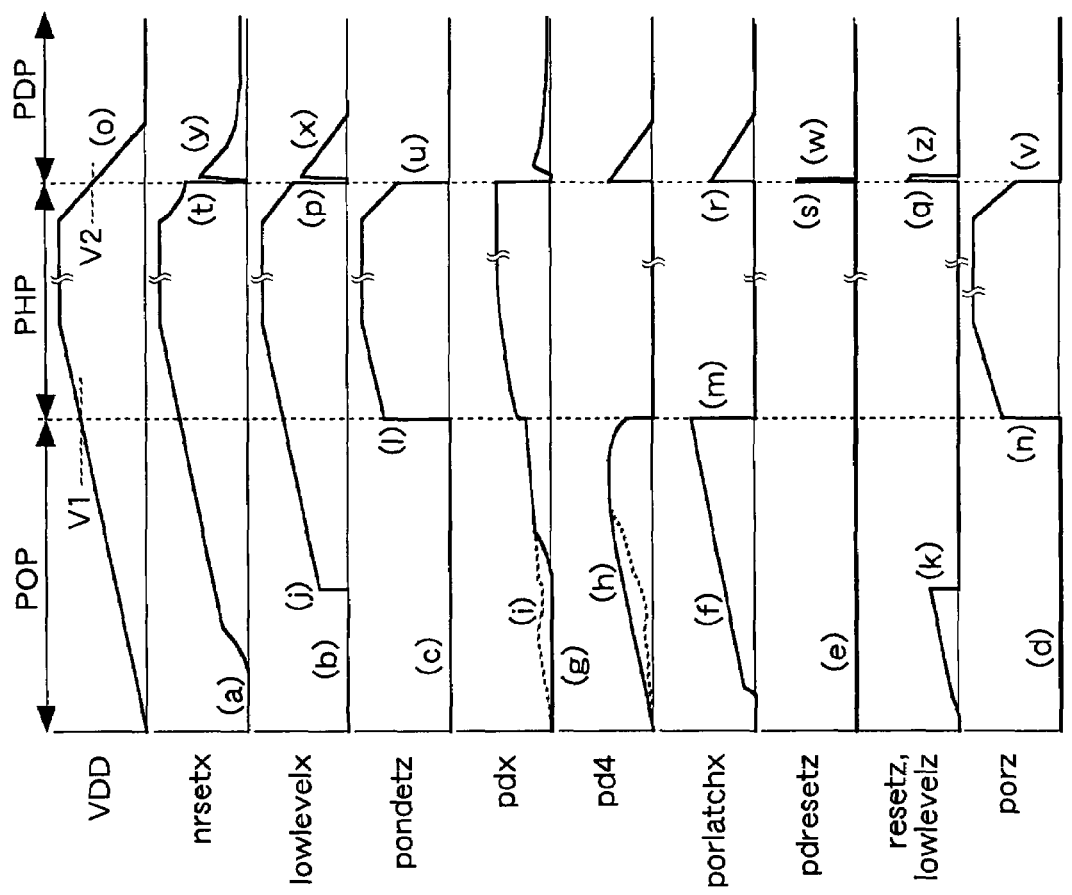
FIG. 7 is a waveform chart showing the operation of the reset circuit of the first embodiment.

FIG. 7 shows the operation of the reset circuit RST of the first embodiment. After the supply of the power supply voltage VDD to the semiconductor device is started (after power-on), the starter circuit STT outputs the low-level initializing signal nrsetx until charging of the capacitor CC0 via the transistor mp48 (resistor element) is started (FIG. 7(a)). In other words, the voltage value of the initializing signal nrsetx gradually increases according to an RC time constant determined by the capacitance value of the capacitor CC0 and the resistance value of the transistor mp48. Thereafter, the transistor mp48 is turned on due to the low level of the node pdx, and thereby the voltage of the initializing signal nrsetx increases following the power supply voltage VDD. The transistor mp37 of the power-on detection circuit PODET and the transistor mp37 of the power-down detection circuit PDDET are turned on by the low-level initializing signal nrsetx, and the power-down detection signal lowlevelx and the power-on detection signal pondetz are set to the low levels (FIG. 7(b, c)).

Similarly, the reset signal porz and the power-down reset signal pdresetz outputted from the power detection control circuit PWRCNT are set to the low levels by the low-level initializing signal nrsetx (FIG. 7(d, e)). The reset signal porz is set to the low level using the initializing signal nrsetx fixed to the low level at power-on, which prevents the voltage from being elevated. The latch circuit LAT is initialized during the low-level period of the power-down detection signal lowlevelx (high-level period of the reset signal resetz) and outputs the high-level latch signal porlatchx (FIG. 7(f)). Namely, the latch circuit LAT is forcibly initialized at power-on.

During the high-level period of the power-down detection signal lowlevelz, the switch SW1 of the power-on detection circuit PODET is turned on, and the gate node pdx of the transistor mn52 constituting the inverter POINV1 is clamped to the ground voltage VSS (FIG. 7(g)). Therefore, the transistor mn52 is certainly turned on during the power-on period POP. The drain node pd4 of the transistor mn52 is charged by a charge path from the load circuit POLD1. No discharge path (leak path) exists. Accordingly, during the power-on period POP, the voltage of the node pd4 can be certainly increased following the power supply voltage VDD (FIG. 7(h)).

Incidentally, the waveform of the power-down detection signal lowlevelz is the same as that of the reset signal resetz. Therefore, the operation of the switch SW1 may be controlled using the reset signal resetz. Alternatively, the operation of the switch SW1 may be directly controlled using the power-down detection signal lowlevelx. At this time, polarities of transistors constituting the switch SW1 need to be reversed. However, if the load of the switch SW1 may have an influence on the waveforms and timings of the reset signal resetz and the power-down detection signal lowlevelx, it is desirable to control the switch SW1 using the power-down detection signal lowlevelz generated by a dedicated buffer (inverter).

When the switch SW1 is not formed in the power-on detection circuit PODET, the voltage of the node pdx slightly increases following the power supply voltage VDD by the operation of the dividing circuit POVD1 during the power-on period POP as shown by the dotted line in the figure (FIG. 7(i)). Consequently, if a leak path occurs between the gate and a source of the transistor mn52, the charging of the node pd4 at power-on becomes insufficient as shown by the dotted line in the figure, so that the power-on detection signal pondetz may not be reset to the low level. Alternatively, the timing of the rising edge of the power-on detection signal pondetz may become earlier, and the power-on period POP (power-on reset period of the ferroelectric memory) may become shorter. In the present invention, by adding the switch SW1, the occurrence of these problems can be prevented.

During the low level of the power-on detection signal pondetz, the dividing circuit PDVD1 of the power-down detection circuit PDDET operates as the load circuit which charges the node pdxd. Since the voltage of the node pdxd increases earlier than the voltage of the node pdx of the power-on detection circuit PODET, the transistor mn52 of the power-down detection circuit PDDET is turned on earlier than the transistor mn52 of the power-on detection circuit PODET. Hence, the rising edge of the power-down detection signal lowlevelx appears earlier than the rising edge of the power-on detection signal pondetz (FIG. 7(*j*)). By the change of the power-down detection signal lowlevelx to the high level, the reset signal resetz of the latch circuit LAT changes to the low level (FIG. 7(*k*)) and gets into a state capable of setting the latch circuit LAT. Note, however, that the latch circuit LAT holds a reset state (porlatchx signal=high level) until the power-on detection signal pondetz is activated.

Incidentally, during the low level of the power-on detection signal pondetz, the power-down detection circuit PDDET turns off the transistors mn32 and mp62 to stop a power-down detection operation. This can prevent a leak current from flowing from the power supply line VDD to the ground line VSS of the power-down detection circuit PDDET during the power-on period POP, which enables a reduction in current consumption.

Further, during the low level of the power-on detection signal pondetz after the power-down detection signal lowlevelx changes to the high level, the dividing circuit POVD1 of the power-on detection circuit PODET outputs a divided voltage to the node pdx. Therefore, the voltage of the node pdx increases gradually dependent on the power supply voltage VDD. When the voltage of the node pdx exceeds the threshold voltage of the transistor mn52, the drain node pd4 of the transistor mn52 changes to the low level, and the power-on detection signal pondetz changes to the high level (FIG. 7(*l*)). By the high levels of the power-on detection signal pondetz and the power-down detection signal lowlevelx, the latch circuit LAT is set, and the latch signal porlatchx is set to the low level (FIG. 7(*m*)).

During the high-level period of the power-down detection signal lowlevelx, the power-on control unit POCNT of the power detection control circuit PWRCNT activates the reset signal porz to the high level upon receiving the low-level latch signal porlatchx (FIG. 7(*n*)). Consequently, the state of the semiconductor device shifts from the power-on period POP to the power hold period PHP. Namely, when the power supply voltage VDD exceeds the first voltage V1, the power-on detection signal pondetz and the reset signal porz are activated, and the power-on period POP ends. The power hold period PHP is a period during which the semiconductor device operates by control of the system. When the semiconductor device is a ferroelectric memory, the power hold period PHP is a period during which the ferroelectric memory is read-accessed or write-accessed.

A circuit requiring initialization in the semiconductor device is initialized during the low-level period of the reset signal porz. The power-down detection circuit PDDET starts the power-down detection operation upon receiving the high-level power-on detection signal pondetz. More specifically, the dividing circuit PDVD1 of the power-down detection circuit PPDET starts to generate the divided voltage, and the load circuit PDLD1 starts to charge the node pd4*d*. On the other hand, during the high-level period of the power-on detection signal pondetz, the power-on detection circuit PODET turns off the transistors mn32 and mp62 to stop a power-on detection operation. This can prevent the leak current from flowing from the power supply line VDD to the ground line VSS of the power-on detection circuit PODET, which enables a reduction in current consumption. In particular, a standby current being a current in a state where the semiconductor device is not accessed can be reduced.

Then, when the supply of the power supply voltage VDD to the semiconductor device is stopped, electric charge charged in the power supply line VDD and a power supply capacitor not shown gradually escapes, and the power supply voltage VDD gradually decreases (FIG. 7(*o*)). With the decrease of the power supply voltage VDD, the voltage of the node pdxd of the power-down detection circuit PDDET gradually decreases, and the source-to-drain current of the transistor mn52 gradually reduces. Then, when the voltage of the drain node pd4*d* of the transistor mn52 becomes higher than a predetermined value, the power-down detection signal lowlevelx changes to the low level (FIG. 7(*p*)). By this change, the reset signal resetz of the latch circuit LAT changes to the high level (FIG. 7(*q*)). The latch circuit LAT is reset by the high-level reset signal resetz and changes the latch signal porlatchx to the high level (FIG. 7(*r*)).

The power-down control unit PDCNT of the power detection control circuit PWRCNT activates the reset signal pdresetz to the high level in response to the power-down detection signal lowlevelx which changes to the low level during the low level of the latch signal porlatchx (FIG. 7(*s*)). By the high-level reset signal pdresetz, the starter circuit STT is initialized, and the initializing signal nrsetx changes to the low level (FIG. 7(*t*)). By the low-level initializing signal nrsetz, the nodes pd4, pd6 of the power-on detection circuit PODET change to the high levels, and the power-on detection signal pondetz changes to the low level (FIG. 7(*u*)). Further, the power detection control circuit PWRCNT changes the reset signals porz, pdresetz to the low levels (FIG. 7(*v*, *w*)). By the change of the reset signal porz to the low level, the state of the semiconductor device shifts from the power hold period PHP to the power-down period PDP. Namely, when the power supply voltage VDD becomes lower than the second voltage V2, the power-on detection signal pondetz and the reset signal porz are inactivated, and the power hold period PHP ends. As just described, in the present invention, with the low level of the power-down detection signal lowlevelx as a trigger, respective circuit blocks in the reset circuit RST can be initialized. Hence, even when the supply of the power supply voltage VDD is stopped by a hot-swap operation, the reset circuit RST can be quickly set to a power-down state.

By the low-level power-on detection signal pondetz, the transistors mn32, mp62 of the power-down detection circuit PDDET are turned off. By turning off the transistor mn32, the dividing circuit PDVD1 operates as the load circuit, and starts to charge the node pdxd (not shown). Consequently, the voltage of the node pdxd increases, the transistor mn52 is turned on, and the node pd4*d* changes to the low level (not shown). A charge path to the node pd4*d* does not exist because the transistor mp62 of the load circuit PDLD1 is turned off, so that the node pd4*d* tends to change to the low level. By this change, the power-down detection signal lowlevelx changes to the high level (FIG. 7(*x*)). Further, in response to the change of the power-down detection signal lowlevelz to the high level, the switch SW1 of the power-on detection circuit PODET is turned on, and the node pdx temporarily changes to the low level. By this change, the transistor mn48 of the starter circuit STT is turned on, and the initializing signal nrsetx changes to the high level (FIG. 7(*y*)). Further, by the high-level power-down detection signal lowlevelx, the reset signal resetz changes to the low level (FIG. 7(*z*)).

Incidentally, in the power-down period PDP, because of the low level of the power-on detection signal pondetz, the power-down detection circuit PDDET stops the power-down detection operation as in the power-on period POP. This can prevent the leak current from flowing from the power supply line VDD to the ground line VSS of the power-down detection circuit PDDET while the power supply voltage VDD is supplied during the power-down period PDP, which enables a reduction in current consumption. Further, during the low-level period of the power-on detection signal pondetz, the power-on detection circuit PODET starts the power-on detection operation as in the power-on period POP. The latch circuit LAT is reset in synchronization with the low-level power-down detection signal lowlevelx, so that even when the supply of the power supply voltage VDD is stopped instantaneously and the power supply voltage VDD increases again, the latch circuit LAT can be normally operated, and power-on can be certainly detected.

Figure 8:
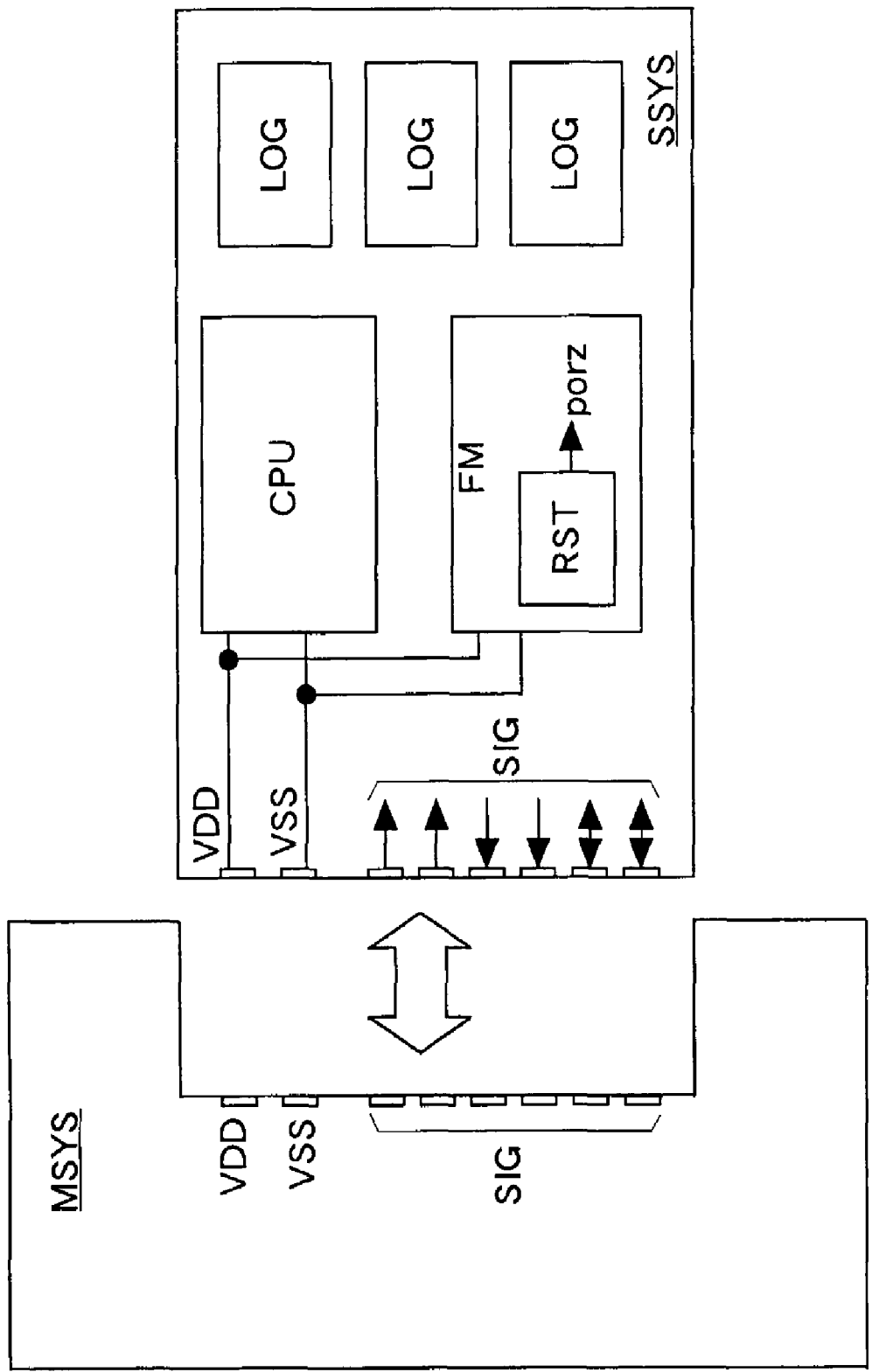
FIG. 8 is a block diagram showing an example of a system including a semiconductor device in which the reset circuit is implemented.

FIG. 8 shows an example of a system including the semiconductor device in which the reset circuit RST is implemented. For example, the system is constituted of a main system apparatus MSYS and a sub system apparatus SSYS. The sub system apparatus SSYS is detachably mounted to the main system apparatus MSYS. Namely, the sub system apparatus SSYS can perform the hot-swap operation for the main system apparatus MSYS. Between the main system apparatus MSYS and the sub system apparatus SSYS, the power supply line VDD, the ground line VSS, and signal lines SIG are connected. The sub system apparatus SSYS is, for example, an IC card, a portable terminal, or the like. Each vertically long small quadrangle in the figure represents an external terminal. The sub system apparatus SSYS includes a CPU, a ferroelectric memory FM, and logic LSIs (LOGs) mounted on a printed-wiring board, a flexible printed-wiring board, or the like. The reset circuit RST is formed in the ferroelectric memory FM. The reset signal porz is used to initialize an internal circuit in the ferroelectric memory FM.

Figure 9:
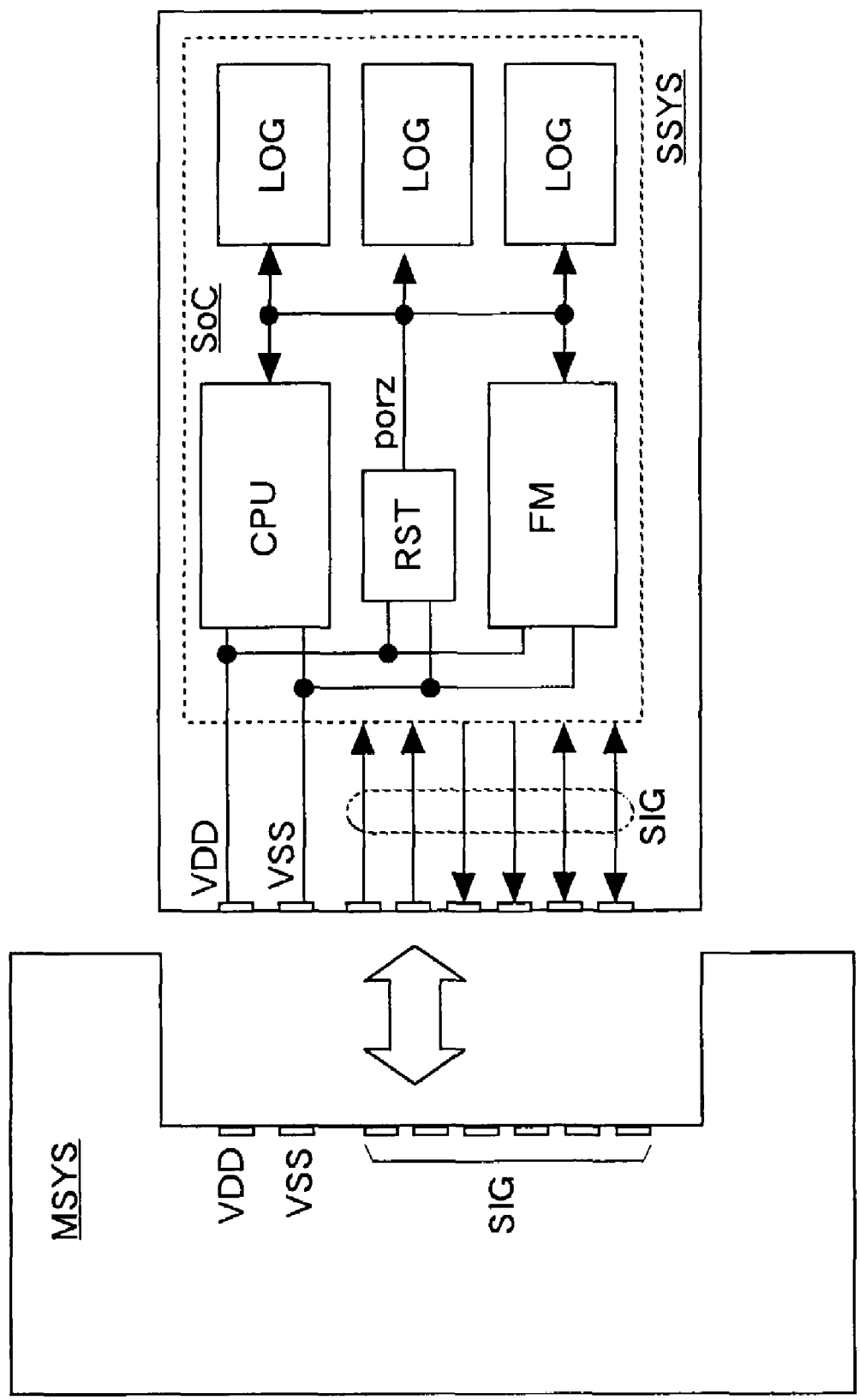
FIG. 9 is a block diagram showing another example of the system including the semiconductor device in which the reset circuit is implemented.

FIG. 9 shows another example of the system including the semiconductor device in which the reset circuit RST is implemented. In this example, the sub system apparatus SSYS is constituted of a SoC (System on Chip) mounted on the printed-wiring board, the flexible printed-wiring board, or the like. The other constitutions are the same as in FIG. 8, and the sub system apparatus SSYS can perform the hot-swap operation for the main system apparatus MSYS.

The SoC includes a CPU core, a ferroelectric memory core FM, logic cores LOG, and the reset circuit RST formed on a semiconductor substrate. The reset signal porz is supplied to the CPU core, the ferroelectric memory core FM, and the logic cores LOG to initialize internal circuits formed in these cores. Incidentally, the reset circuit RST may be formed in any of the CPU core, the ferroelectric memory core FM, and the logic cores LOG. In this case, the reset signal porz is supplied to a core where the reset circuit RST is formed and external cores.

As described above, in the first embodiment, the power-on detection circuit PODET includes the switch SW1 which connects the node pdx to the ground line VSS, and the switch SW1 is tuned on in synchronization with the power-down detection signal lowlevelz (lowlevelx) activated in the first half of the power-on period POP. Consequently, the transistor mn52 can be certainly turned off in the first half of the power-on period POP. The reset signal porz generated using the power-on detection signal pondetz can be certainly set to the low level (reset level) in the first half of the power-on period POP, so that the internal circuit of the sub system apparatus SSYS can be certainly initialized.

The operation of the switch SW1 is controlled using the power-down detection signal lowlevelz which is inactivated earlier than the activation timing of the power-on detection signal pondetz. Therefore, the dividing circuit POVD1 can generate a normal divided voltage at the node pdx using the remaining inactivation period of the power-on detection signal pondetz in the power-on period POP. Namely, the power-down detection circuit PDDET can prevent the power-on detection signal pondetz and the reset signal porz from being elevated in the first half of the power-on period POP, and certainly activate the power-on detection signal pondetz and the reset signal porz in the second half of the power-on period POP. Further, since the switch SW1 can be certainly turned off in the first half of the power-on period POP, the leak current flowing via the switch SW1 can be reduced.

Figure 10:
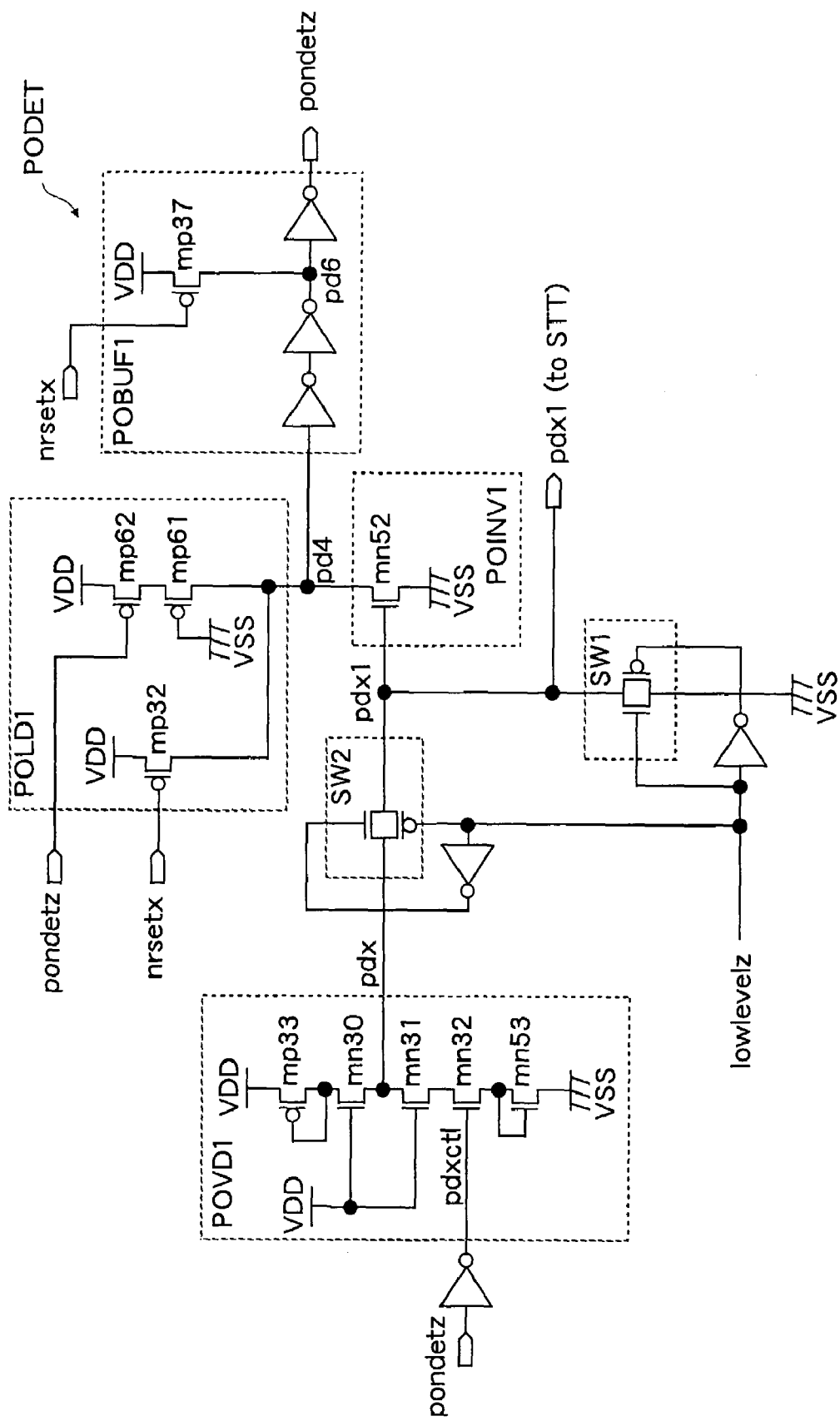
FIG. 10 is a circuit diagram showing a power-on detection circuit in a reset circuit of a second embodiment.

FIG. 10 shows the power-on detection circuit PODET in the reset circuit RST of a second embodiment. The same reference symbols are used to designate the same elements as those described in the first embodiment, and a detailed description thereof is omitted. Circuits other than the power-on detection circuit PODET are the same as in the first embodiment. The reset circuit RST is formed in the sub system apparatus SSYS shown in FIG. 8 or FIG. 9.

The power-on detection circuit PODET is constituted by adding a leak prevention switch SW2 to the power-on detection circuit PODET of the first embodiment. The other constitutions of the power-on detection circuit PODET are the same as in the first embodiment. The leak prevention switch SW2 is disposed between a source of the transistor mn30 of the dividing circuit POVD1 (first connection node pdx) and the gate of the transistor mn52 of the inverter POINV1 (node pdx1). The switch SW2 is constituted of a CMOS transmission gate and turned off during the activation of the power-down detection signal lowlevelz (lowlevelx), and cuts off a connection between the nodes pdx, pdx1. The switch SW2 is turned on during the inactivation of the power-down detection signal lowlevelz and connects the node pdx to the node pdx1. In other words, the switch SW2 cuts off a current path between the dividing circuit POVD1 and the node pdx1 when the power-down detection signal lowlevelx is set to the low level during the power-on period POP (a predetermined period after power-on).

As described in FIG. 7, the dividing circuit POVD1 of the power-on detection circuit PODET generates the divided voltage at the node pdx during the power-on period POP from when the supply of the power supply voltage VDD is started until when the power-on detection signal pondetz is activated. The switch SW2 prevents the leak current from flowing from the node pdx to the ground line VSS via the node pdx1 via the switch SW1 which is turned on in the first half of the power-on period POP. Incidentally, the switch SW2 may be formed by only a pMOS transistor. Further, if the gate-to-source voltage which can certainly transmit the electric charge of the node pdx to the node pdx1 can be secured, the switch SW2 may be formed by only an nMOS transistor. Furthermore, as in the first embodiment, the operations of the switches SW1, SW2 may be controlled using the reset signal resetz. Alternatively, the operations of the switches SW1, SW2 may be directly controlled using the power-down detection signal lowlevelx.

Figure 11:
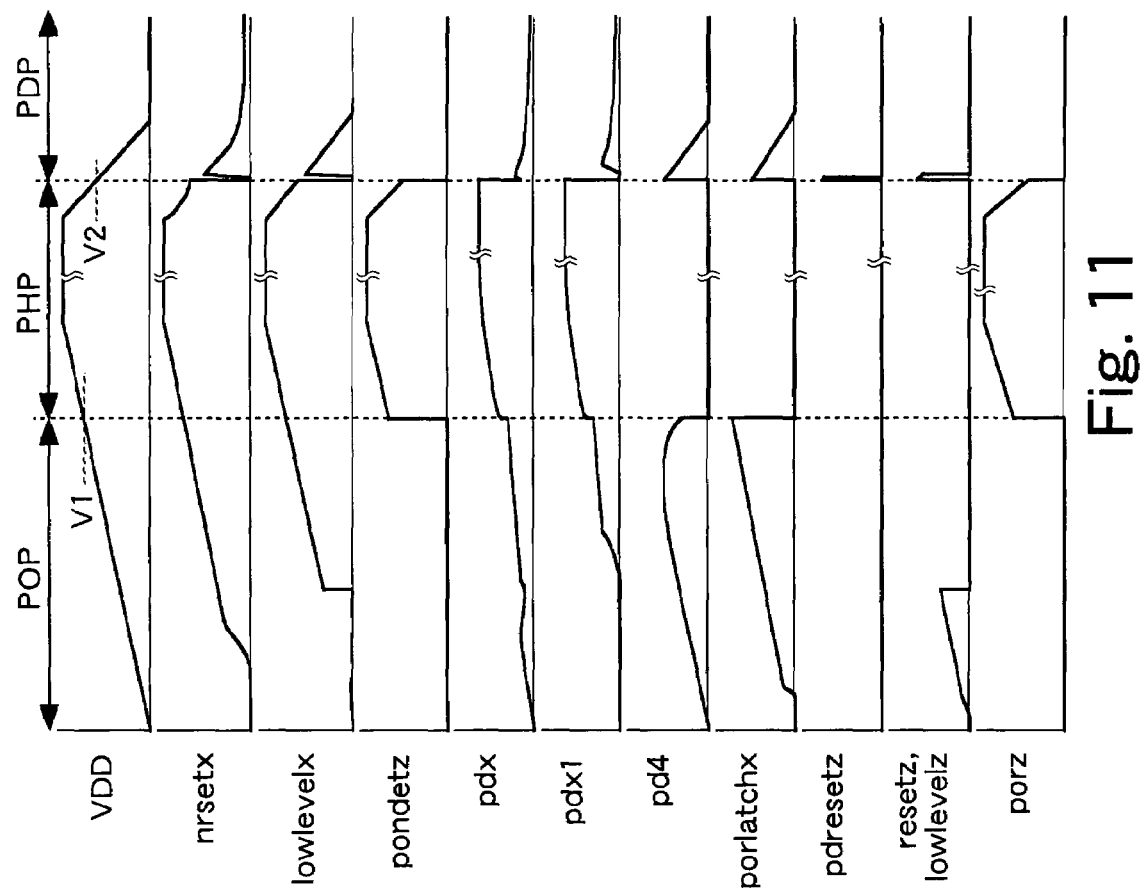
FIG. 11 is a waveform chart showing the operation of the reset circuit of the second embodiment.

FIG. 11 shows the operation of the reset circuit RST of the second embodiment. In this embodiment, even when the dividing circuit POVD1 of the power-on detection circuit PODET performs the power-on detection operation and outputs the divided voltage to the node pdx during the power-on period POP, the connection between the node pdx and the node pdx1 can be cut off by the switch SW2. Accordingly, the gate of the transistor mn52 (node pdx1) can be certainly clamped to the ground voltage VSS, which can prevent the leak current from flowing from the node pdx to the ground line VSS. Incidentally, waveforms other than waveforms of the nodes pdx, pdx1 are the same as in FIG. 7.

As described above, also in the second embodiment, the same effect as in the above first embodiment can be obtained. Further, in this embodiment, during the power-on period POP, the reset signal porz can be certainly generated while the current consumption is reduced.

Figure 12:
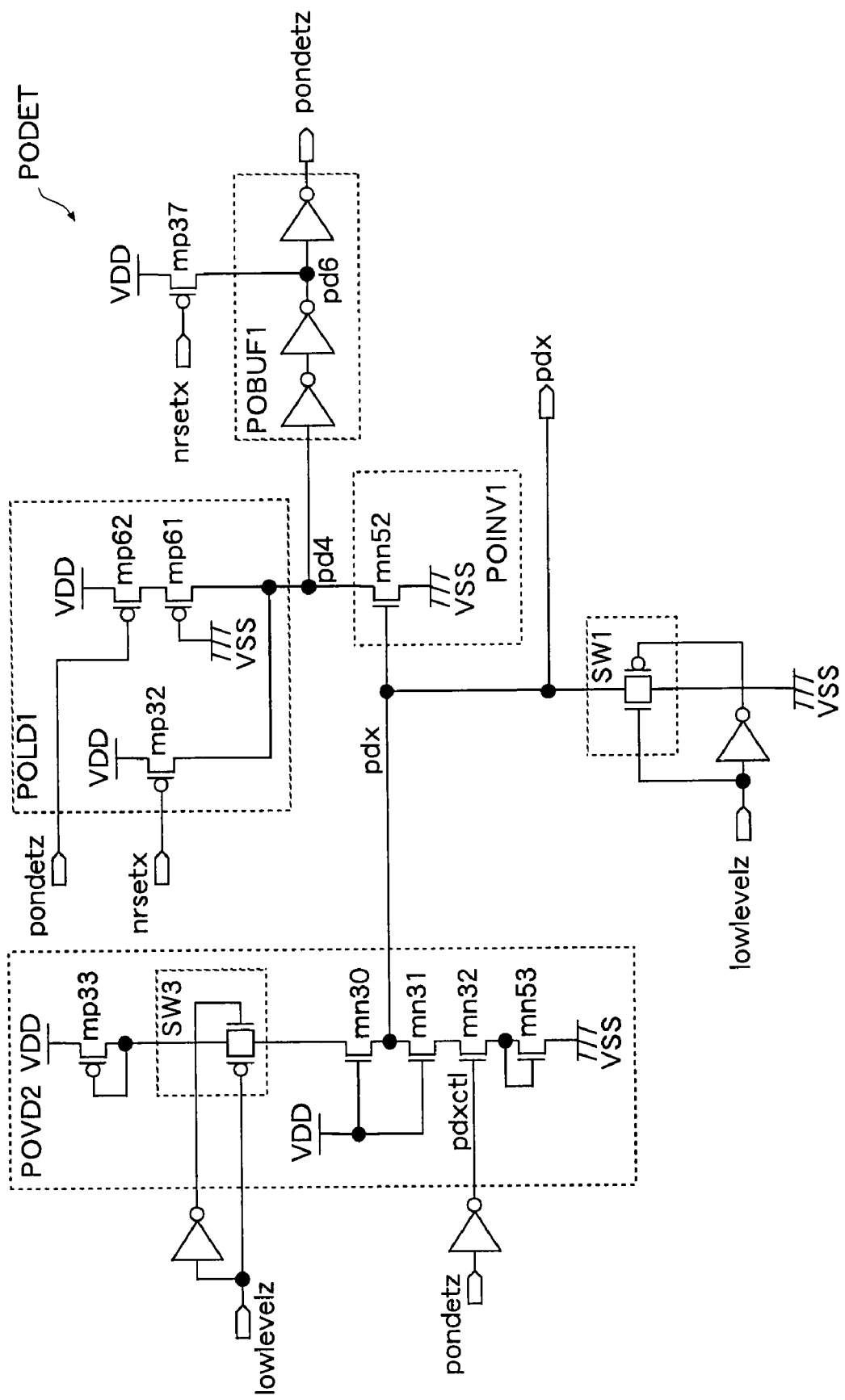
FIG. 12 is a circuit diagram showing a power-on detection circuit in a reset circuit of a third embodiment.

FIG. 12 shows the power-on detection circuit PODET in the reset circuit RST of a third embodiment. The same reference symbols are used to designate the same elements as those described in the first embodiment, and a detailed description thereof is omitted. Circuits other than the power-on detection circuit PODET are the same as in the first embodiment. The reset circuit RST is formed in the sub system apparatus SSYS shown in FIG. 8 or FIG. 9. The power-on detection circuit PODET includes a dividing circuit POVD2 instead of the dividing circuit POVD1 of the first embodiment. The other constitutions of the power-on detection circuit PODET are the same as in the first embodiment.

The dividing circuit POVD2 is constituted by disposing a leak prevention switch SW3 between the transistors mp33, mn30. The switch SW3 is constituted of a CMOS transmission gate, and cuts off a connection between a drain of the transistor mp33 and a drain of the transistor mn30 during the activation of the power-down detection signal lowlevelz (lowlevelx). The switch SW3 connects the drain of the transistor mp33 to the drain of the transistor mn30 during the inactivation of the power-down detection signal lowlevelz. In other words, the switch SW3 temporarily stops the power-on detection operation by the dividing circuit POVD2 when the power-down detection signal lowlevelx is set to the low level during the power-on period POP (during a predetermined period immediately after power-on). Consequently, during the high level of the power-down detection signal lowlevelz, a charge path from the dividing circuit POVD2 to the node pdx does not exist. Hence, the current consumption of the dividing circuit POVD2 can be reduced, and the gate of the transistor mn52 (node pdx) can be certainly clamped to the ground voltage VSS. The power-on detection operation by the power-on detection circuit PODET is started in synchronization with the rising edge of the power-down detection signal lowlevelx.

Incidentally, the switch SW3 may be formed by only a PMOS transistor. Further, if the gate-to-source voltage which can certainly transmit the electric charge supplied via the transistor mp33 to the transistor mn30 can be secured, the switch SW3 may be formed by only an nMOS transistor. Furthermore, as in the first embodiment, the operations of the switches SW1, SW3 may be controlled using the reset signal resetz. Alternatively, the operations of the switches SW1, SW3 may be directly controlled using the power-down detection signal lowlevelx. As described above, also in the third embodiment, the same effects as in the above first and second embodiments can be obtained.

Figure 13:
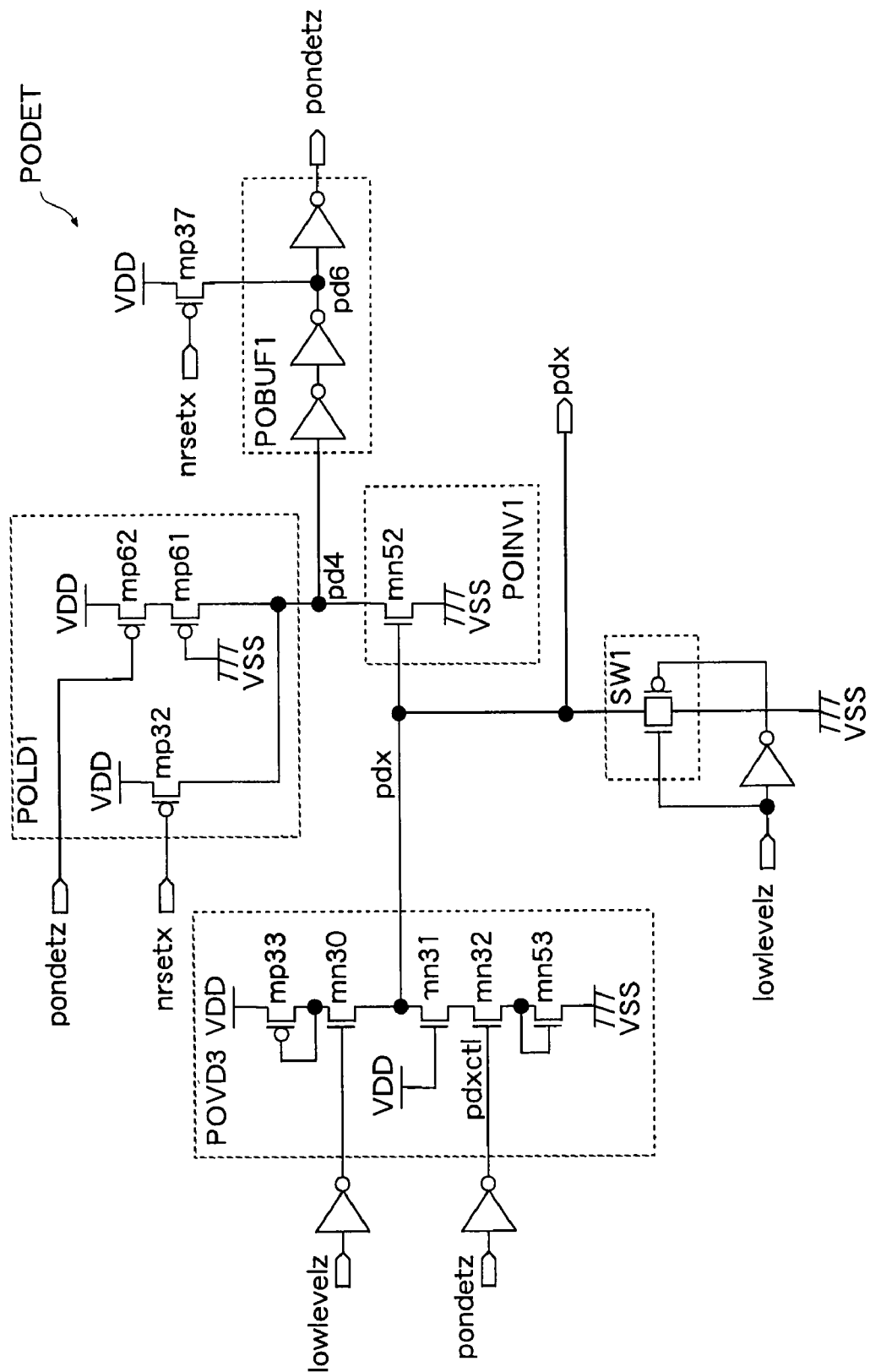
FIG. 13 is a circuit diagram showing a power-on detection circuit in a reset circuit of a fourth embodiment.

FIG. 13 shows the power-on detection circuit PODET in the reset circuit RST of a fourth embodiment. The same reference symbols are used to designate the same elements as those described in the first embodiment, and a detailed description thereof is omitted. Circuits other than the power-on detection circuit PODET are the same as in the first embodiment. The reset circuit RST is formed in the sub system apparatus SSYS shown in FIG. 8 or FIG. 9. The power-on detection circuit PODET includes a dividing circuit POVD3 instead of the dividing circuit POVD1 of the first embodiment. The other constitutions of the power-on detection circuit PODET are the same as in the first embodiment.

The dividing circuit PODV3 receives a signal obtained by inverting the level of the power-down detection signal lowlevelz at the gate of the transistor mn30 operating as the first resistor element. Namely, in this embodiment, the transistor mn30 also serves as the switch SW3 of the third embodiment. The transistor mn30 is turned off during the activation of the power-down detection signal lowlevelz (lowlevelx) and cuts off a connection between the drain of the transistor mp33 and a drain of the transistor mn31. The transistor mn30 is turned on during the inactivation of the power-down detection signal lowlevelz and connects the drain of the transistor mp33 to the drain of the transistor mn31. The power-on detection operation by the dividing circuit POVD3 is temporarily stopped when the power-down detection signal lowlevelx is set to the low level during the power-on period POP. The operation of the power-on detection circuit PODET is the same as in the third embodiment. Incidentally, as in the first embodiment, the operations of the switch SW1 and the transistor mn30 may be controlled using the reset signal resetz or may be directly controlled using the power-down detection signal lowlevelx.

As described above, also in the fourth embodiment, the same effects as in the above first and second embodiments can be obtained. Further, by operating the transistor mn30 as a switch, the circuit scale of the dividing circuit POVD3 can be prevented from increasing when the reset signal porz is certainly generated. Furthermore, when the dividing circuit POVD1 of the first embodiment is already designed, its circuit data and circuit characteristic can be used without change. As a result, the design period can be shortened.

Figure 14:
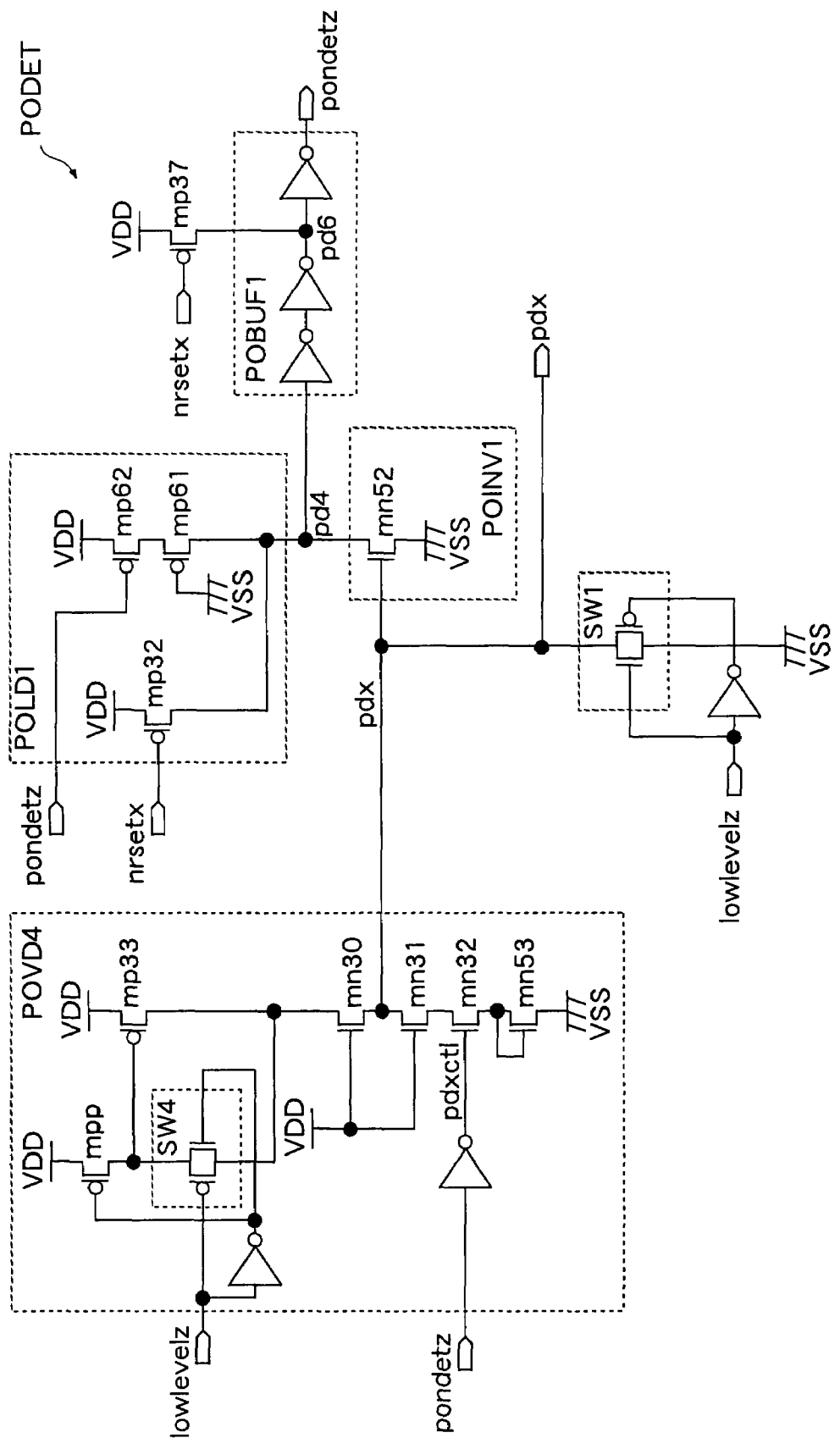
FIG. 14 is a circuit diagram showing a power-on detection circuit in a reset circuit of a fifth embodiment.

FIG. 14 shows the power-on detection circuit PODET in the reset circuit RST of a fifth embodiment. The same reference symbols are used to designate the same elements as those described in the first embodiment, and a detailed description thereof is omitted. Circuits other than the power-on detection circuit PODET are the same as in the first embodiment. The reset circuit RST is formed in the sub system apparatus SSYS shown in FIG. 8 or FIG. 9. The power-on detection circuit PODET includes a dividing circuit POVD4 instead of the dividing circuit POVD1 of the first embodiment. The other constitutions of the power-on detection circuit PODET are the same as in the first embodiment.

The dividing circuit POVD4 is constituted by adding a pMOS transistor mpp (voltage control switch) and a connection switch SW4 to the dividing circuit POVD1 of the first embodiment. The pMOS transistor mpp is turned on during the activation of the power-down detection signal lowlevelz (lowlevelx) to connect a gate of the transistor mp33 (third transistor) to the power supply line VDD. Namely, the transistor mp33 is turned off to temporarily stop the power-on detection operation by the dividing circuit POVD4 when the power-down detection signal lowlevelz is activated to the high level during the power-on period POP (during a predetermined period immediately after power-on). In this embodiment, the transistor mp33 serves as the leak prevention switch SW3 of the third embodiment. Consequently, during the high level of the power-down detection signal lowlevelz (during the low level of lowlevelx), a charge path from the dividing circuit POVD4 to the node pdx does not exist. Hence, the current consumption of the dividing circuit POVD4 can be reduced, and the gate of the transistor mn52 (node pdx) can be certainly clamped to the ground voltage VSS during the predetermined period immediately after power-on (during the low level of lowlevelx).

The connection switch SW4 is turned off during the activation of the power-down detection signal lowlevelz and turned on during the inactivation of the power-down detection signal lowlevelz. Therefore, after the power-down detection signal lowlevelz is inactivated to the low level in the second half of the power-on period POP, the gate of the transistor mp33 is connected to its drain, and the dividing circuit POVD4 becomes equivalent to the dividing circuit POVD1 of the first embodiment. In other words, the power-on detection operation by the dividing circuit POVD4 is started in synchronization with the rising edge (inactivation) of the power-down detection signal lowlevelx.

Incidentally, the switch SW4 may be formed by only a pMOS transistor or only an nMOS transistor. Further, as in the first embodiment, the operations of the switches SW1, SW4 and the transistors mpp, mp33 may be controlled using the reset signal resetz, or may be directly controlled using the power-down detection signal lowlevelx. As described above, also in the fifth embodiment, the same effects as in the above first and second embodiments can be obtained.

Figure 15:
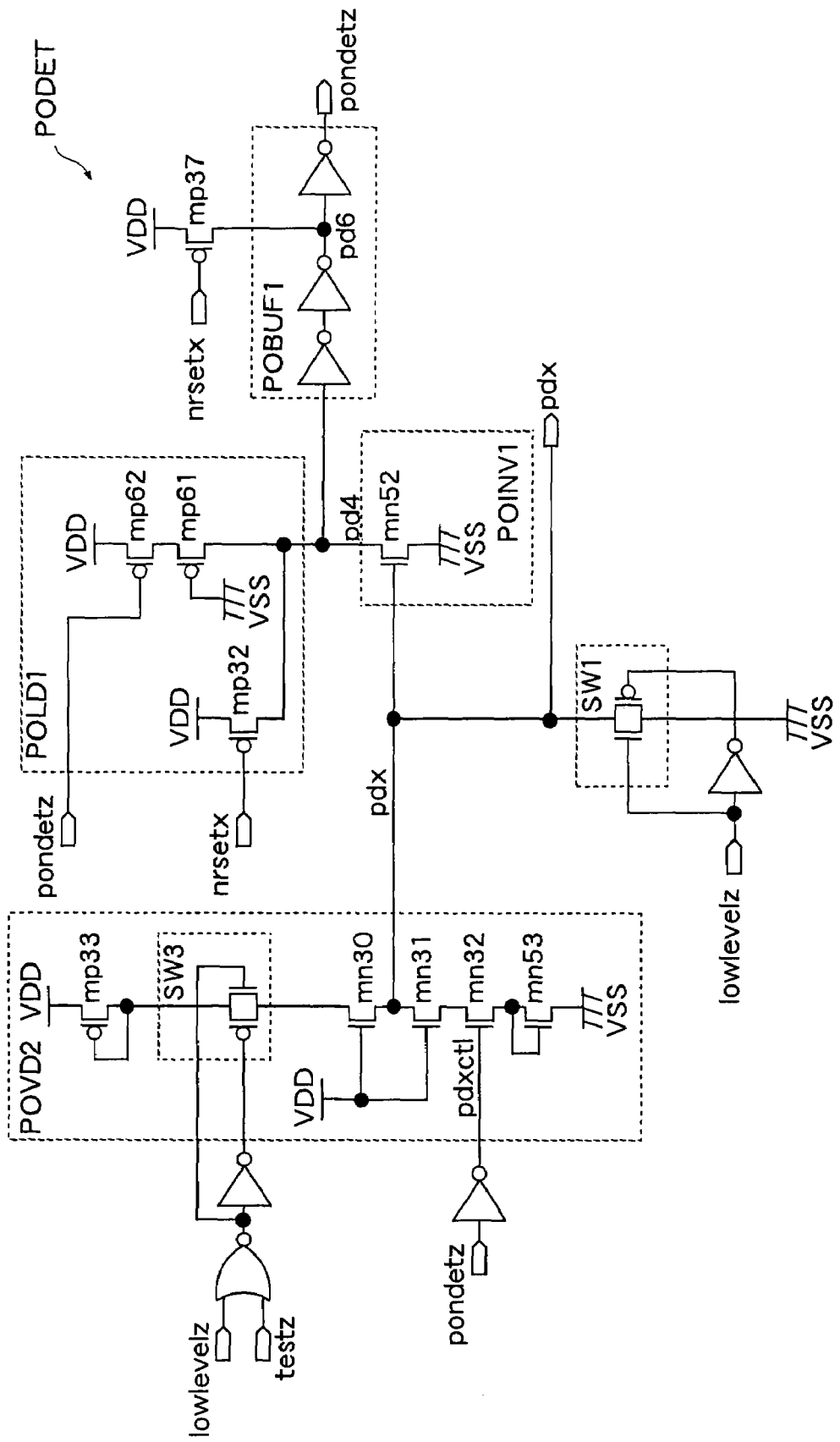
FIG. 15 is a circuit diagram showing a power-on detection circuit in a reset circuit of a sixth embodiment.

FIG. 15 shows the power-on detection circuit PODET in the reset circuit RST of a sixth embodiment. The same reference symbols are used to designate the same elements as those described in the first and third embodiments, and a detailed description thereof is omitted. Circuits other than the power-on detection circuit PODET are the same as in the first embodiment. The reset circuit RST is formed in the sub system apparatus SSYS shown in FIG. 8 or FIG. 9. In the power-on detection circuit PODET, the logic of controlling the switch SW3 of the dividing circuit POVD2 is different from that of the third embodiment. The other constitutions of the power-on detection circuit PODET are the same as in the third embodiment.

In this embodiment, the switch SW3 is turned off during the activation of the power-down detection signal lowlevelz or the activation of the test signal testz to cut off the connection between the drain of the transistor mp33 and the drain of the transistor mn30. Further, the switch SW3 is turned on during the inactivation of the power-down detection signal lowlevelz and the test signal testz to connect the drain of the transistor mp33 to the drain of the transistor mn30.

Figure 16:
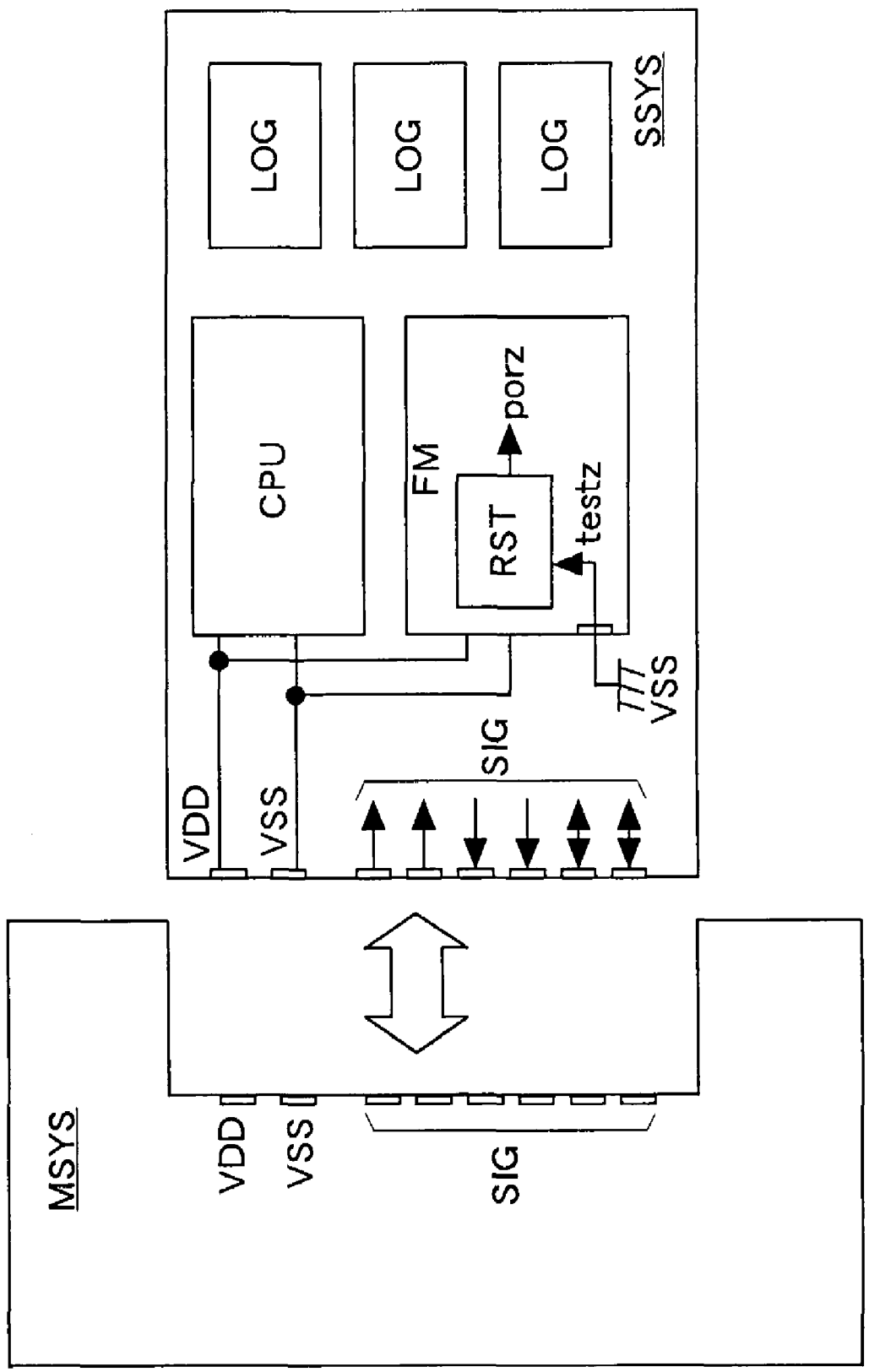
FIG. 16 is a block diagram showing an example of a system including a semiconductor device in which the reset circuit is implemented in the sixth embodiment.

The test signal testz is activated to the high level, for example, when the standby current of the semiconductor device such as the ferroelectric memory FM shown in FIG. 16 is measured. The test signal testz is fixed to the low level in a state where the ferroelectric memory FM is mounted in the test sub system apparatus SSYS. Therefore, the test signal testz is activated only during a test mode in which the ferroelectric memory FM is tested. In this embodiment, the standby current of the ferroelectric memory FM which does not include the leak current of the dividing circuit POVD2 can be measured by cutting off a leak path from the power supply line VDD to the ground line VSS in the dividing circuit POVD2 during the test mode. For example, the subthreshold current or the like of a memory cell array can be measured.

FIG. 16 shows an example of a system including a semiconductor device in which the reset circuit RST of the sixth embodiment is implemented. The ferroelectric memory FM includes an external test terminal which receives the test signal testz. Similarly to the other signal lines SIG, power supply line VDD, and VSS, the external test terminal is connected to a test apparatus such as an LSI tester when the ferroelectric memory FM is tested. The sub system apparatus SSYS is constituted by adding a wiring pattern which connects a signal line of the test signal testz to the ground line VSS. The other constitutions of the system are the same as in FIG. 8 described above.

Figure 17:
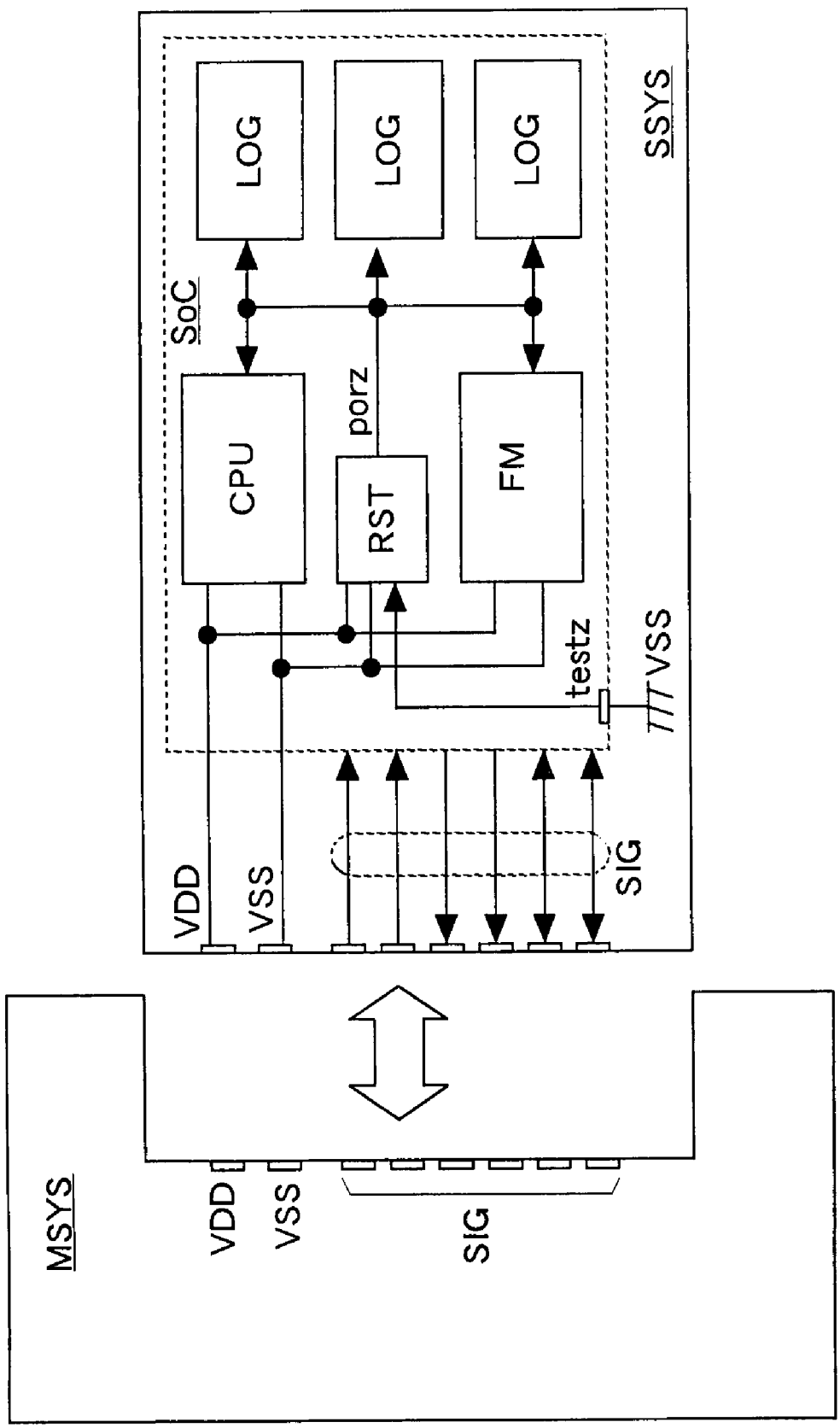
FIG. 17 is a block diagram showing another example of the system including the semiconductor device in which the reset circuit is implemented in the sixth embodiment.

FIG. 17 shows another example of the system including the semiconductor device in which the reset circuit RST of the sixth embodiment is implemented. The sub system apparatus SSYS is constituted by adding a wiring pattern which connects a signal line of the test signal testz supplied to the reset circuit RST of the SoC to the ground line. The other constitutions of the system are the same as in FIG. 9 described above. Similarly to the other signal lines SIG, power supply line VDD, and VSS, an external test terminal which receives the test signal testz in the SoC is connected to the test apparatus such as the LSI tester when the SoC is tested.

As described above, also in the sixth embodiment, the same effects as in the above first and third embodiments can be obtained. Further, in this embodiment, the standby current can be accurately measured when the semiconductor device such as the ferroelectric memory FM is tested. In particular, the subthreshold current flowing through a memory cell array or a circuit operating in an analog manner or the like can be measured.

Figure 18:
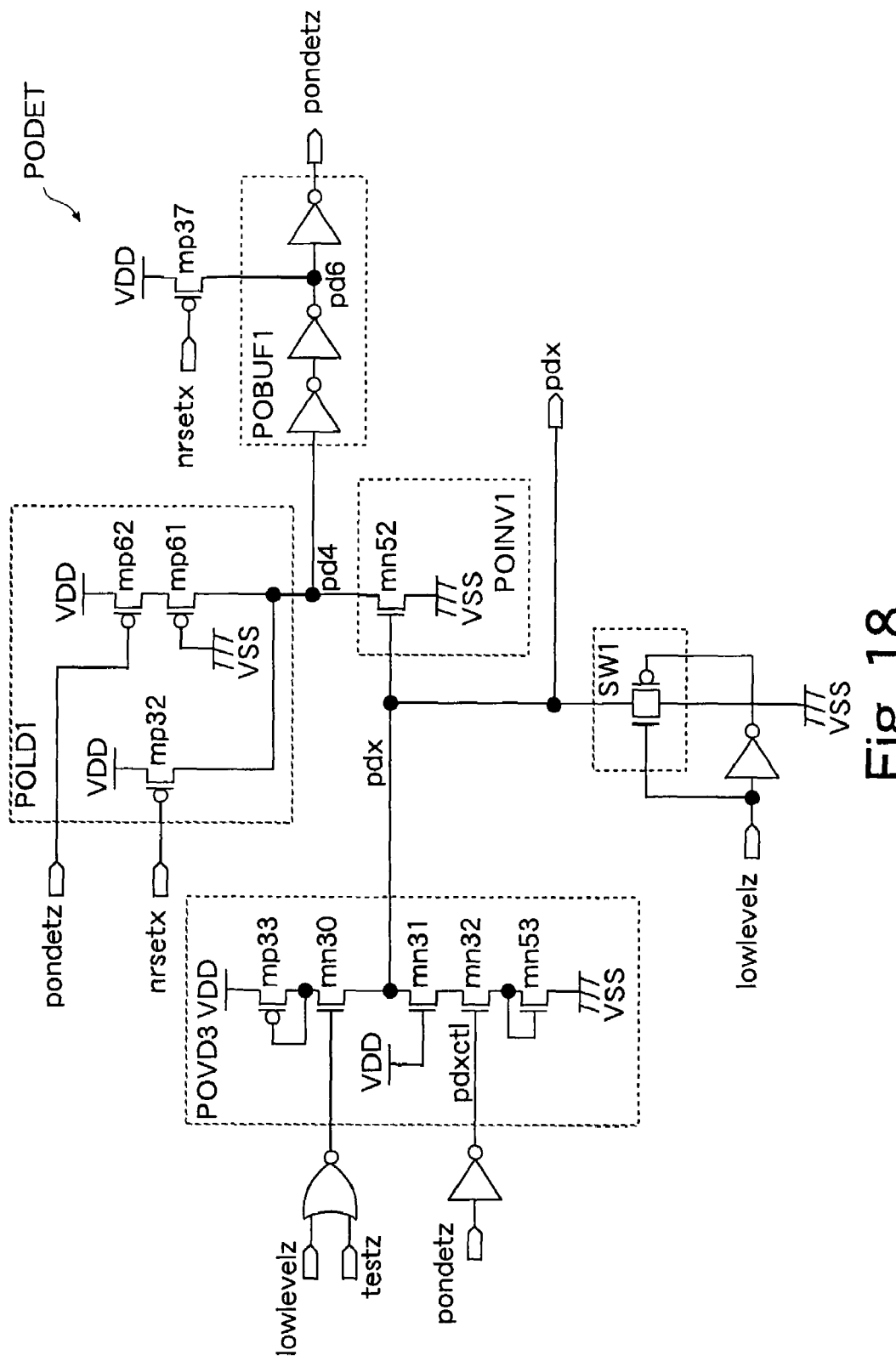
FIG. 18 is a circuit diagram showing a power-on detection circuit in a reset circuit of a seventh embodiment.

FIG. 18 shows the power-on detection circuit PODET in the reset circuit RST of a seventh embodiment. The same reference symbols are used to designate the same elements as those described in the first and fourth embodiments, and a detailed description thereof is omitted. Circuits other than the power-on detection circuit PODET are the same as in the first embodiment. The reset circuit RST is formed in the sub system apparatus SSYS shown in FIG. 16 or FIG. 17. In the power-on detection circuit PODET, the logic of controlling the transistor mn30 of the dividing circuit POVD3 is different from that of the fourth embodiment. The other constitutions of the power-on detection circuit PODET are the same as in the fourth embodiment.

In this embodiment, the transistor mn30 is turned off during the activation of the power-down detection signal lowlevelz or the activation of the test signal testz to cut off a connection between the power supply line VDD and the node pdx. Further, the transistor mn30 is turned on during the inactivation of the power-down detection signal lowlevelz and the test signal testz to connect the power supply line VDD to the node pdx via the transistor mp33.

As in the sixth embodiment, the test signal testz is activated to the high level, for example, when the standby current of the semiconductor device such as the ferroelectric memory FM is measured. The test signal testz is fixed to the low level in the state where the ferroelectric memory FM is mounted in the test sub system apparatus SSYS. Therefore, the test signal testz is activated only during the test mode in which the ferroelectric memory FM is tested. As described above, also in the seventh embodiment, the same effects as in the above first, third, and sixth embodiments can be obtained.

Figure 19:
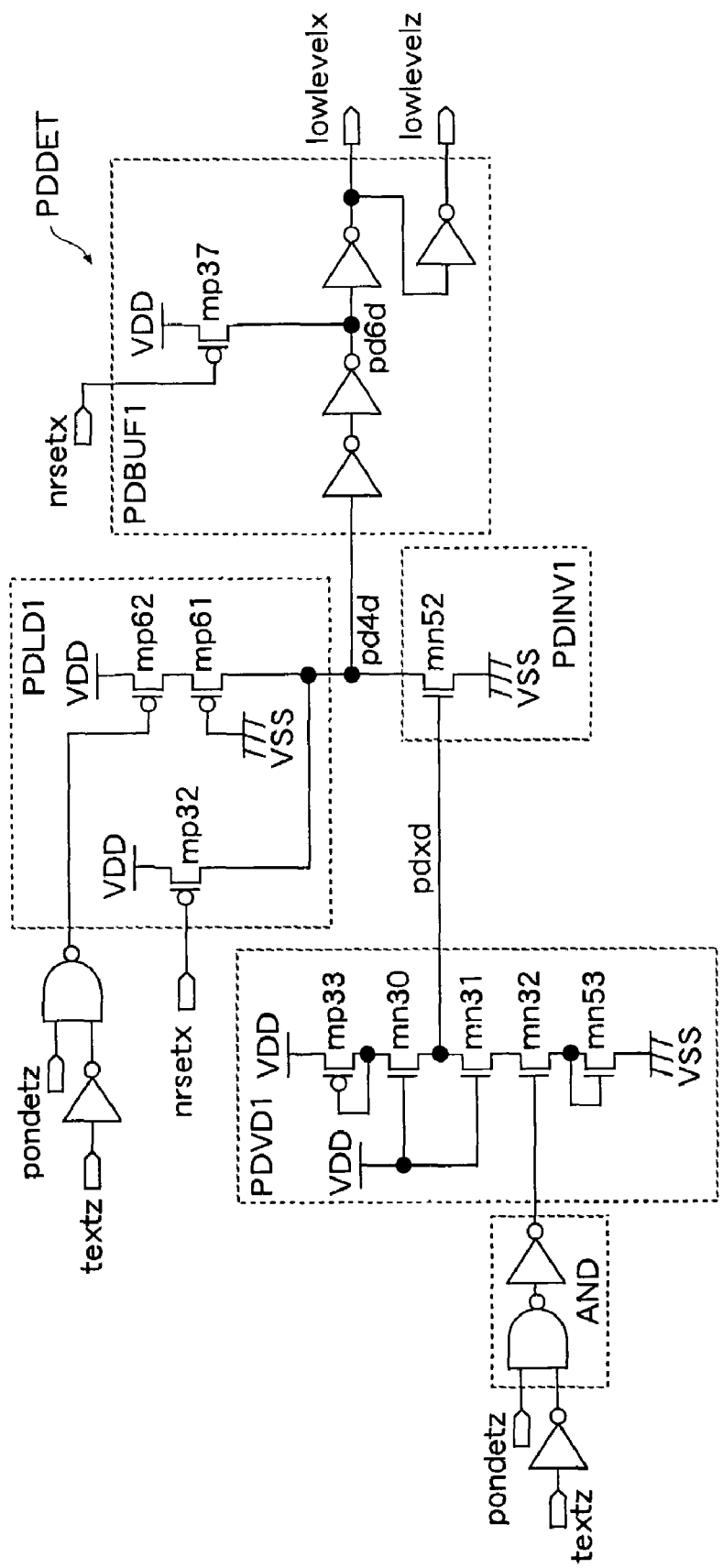
FIG. 19 is a circuit diagram showing a power-down detection circuit in a reset circuit of an eighth embodiment.

FIG. 19 shows the power-down detection circuit PDDET in the reset circuit RST of an eighth embodiment. The same reference symbols are used to designate the same elements as those described in the first embodiment, and a detailed description thereof is omitted. Circuits other than the power-down detection circuit PDDET are the same as in the first embodiment. The reset circuit RST is formed in the sub system apparatus SSYS shown in FIG. 16 or FIG. 17. In the power-down detection circuit PDDET, the logic of controlling the transistor mn32 of the dividing circuit PDVD1 and the logic of controlling the transistor mp62 of the load circuit PDLD1 are different from those of the first embodiment. The other constitutions of the power-down detection circuit PDDET are the same as in the first embodiment.

In this embodiment, the transistor mn32 of the dividing circuit PDVD1 is turned off during the inactivation of the power-on detection signal pondetz or the activation of the test signal testz. Further, the transistor mn32 is turned on when the power-on detection signal pondetz is activated during the inactivation of the test signal testz. The current consumption of the dividing circuit PDVD1 is reduced while the transistor mn32 is off. The dividing circuit PDVD1 generates the divided voltage at the node pdxd while the transistor mn32 is on.

As in the sixth embodiment, the test signal testz is activated to the high level, for example, when the standby current of the semiconductor device such as the ferroelectric memory FM is measured. The test signal testz is fixed to the low level in the state where the ferroelectric memory FM is mounted in the test sub system apparatus SSYS. Therefore, the test signal testz is activated only during the test mode in which the ferroelectric memory FM is tested. As described above, also in the eighth embodiment, the same effects as in the above first, third, and sixth embodiments can be obtained.

Figure 20:
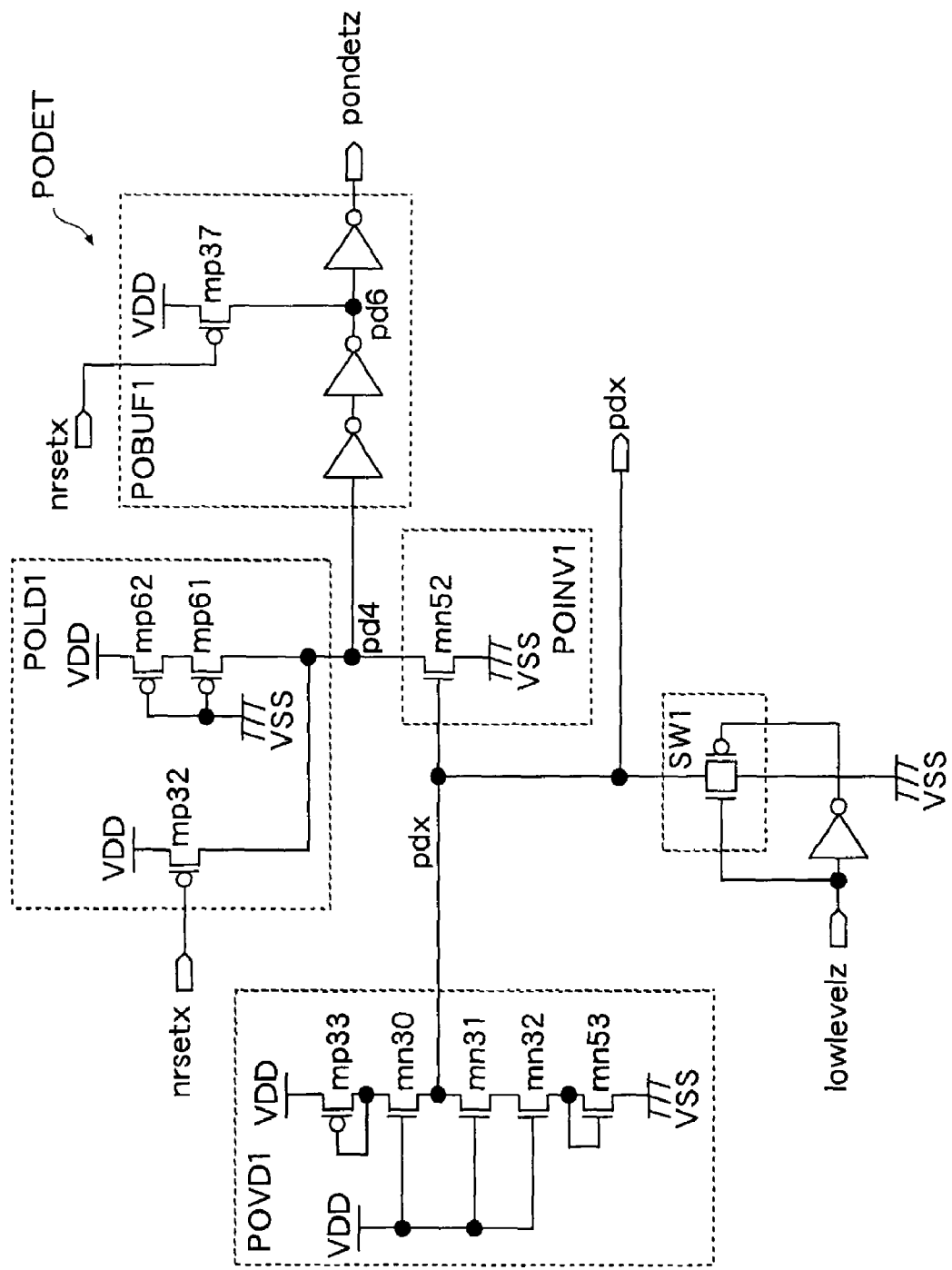
FIG. 20 is a circuit diagram showing a power-on detection circuit in a reset circuit of a ninth embodiment.
Figure 21:
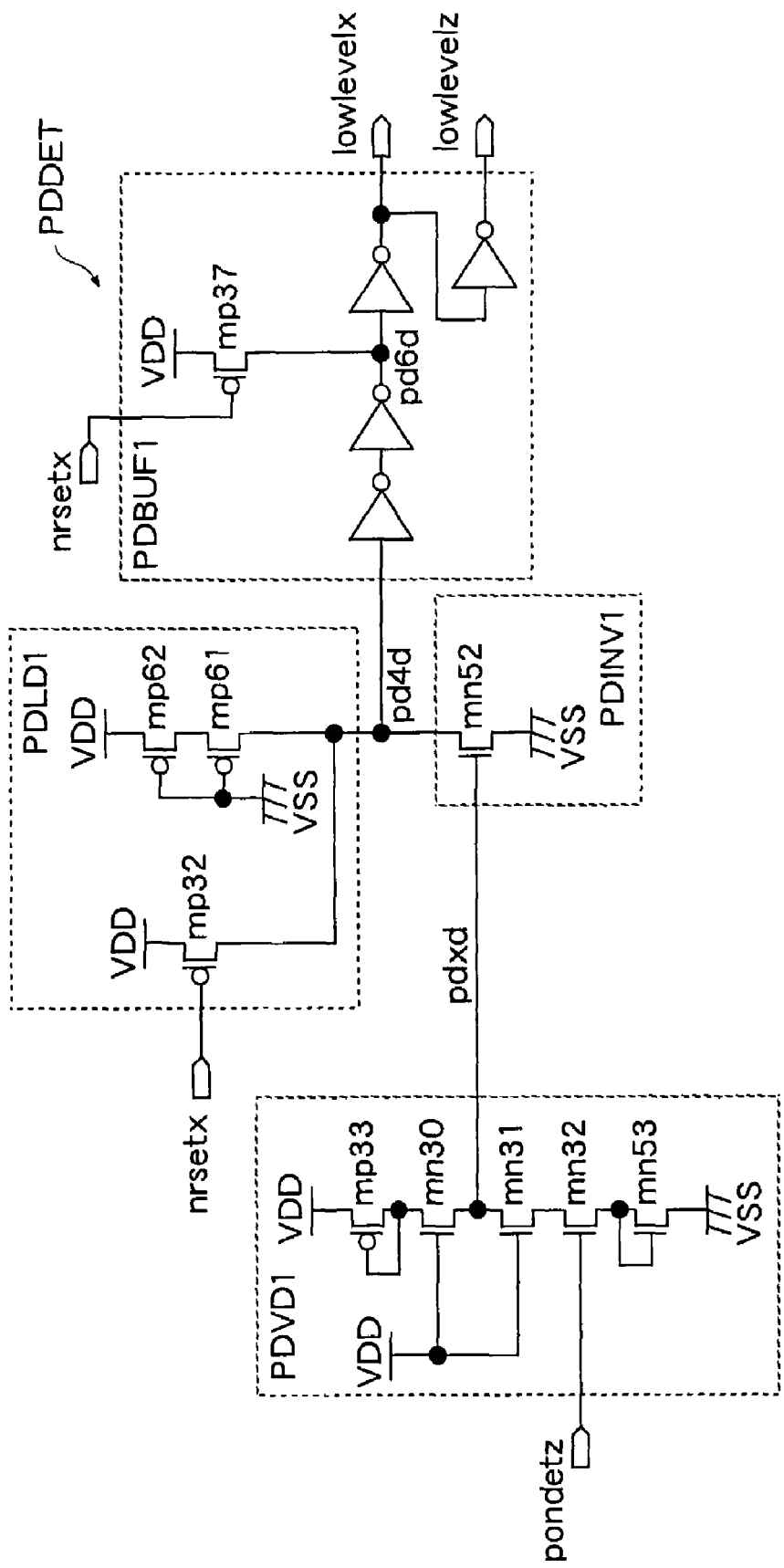
FIG. 21 is a circuit diagram showing a power-down detection circuit in the reset circuit of the ninth embodiment.

FIG. 20 and FIG. 21 show the power-on detection circuit PODET and the power-down detection circuit PDDET in the reset circuit RST of a ninth embodiment. The same reference symbols are used to designate the same elements as those described in the first embodiment, and a detailed description thereof is omitted. Circuits other than the power-on detection circuit PODET and the power-down detection circuit PDDET are the same as in the first embodiment. The reset circuit RST is formed in the sub system apparatus SSYS shown in FIG. 16 or FIG. 17.

In the power-on detection circuit PODET shown in FIG. 20, the gate of the transistor mn32 of the dividing circuit POVD1 is connected to the power supply line VDD, and the transistor mn32 always operates as a resistor element. A gate of the transistor mp62 of the load circuit POLD1 is connected to the ground line VSS, and the transistor mp62 always operates as a resistor element. The other constitutions of the power-on detection circuit PODET are the same as in the first embodiment. In the power-down detection circuit PDDET shown in FIG. 21, a gate of the transistor mp62 of the load circuit PDLD1 is connected to the ground line VSS, and the transistor mp62 always operates as a resistor element. The other constitutions of the power-down detection circuit PDDET are the same as in the first embodiment.

In this embodiment, the dividing circuit POVD1 and the load circuit POLD1 of the power-on detection circuit PODET and the load circuit PDLD1 of the power-down detection circuit PDDET always operate irrespective of the power-on detection signal pondetz. In this case, the standby current increases compared to the first embodiment. However, as in the first embodiment, the node pdx of the power-on detection circuit PODET is clamped to the ground voltage VSS at the beginning of the power-on period POP by the switch SW1. Hence, the transistor mn52 can be certainly turned off during the power-on period POP, and the power-on detection signal pondetz can be certainly generated. As described above, also in the ninth embodiment, the same effect as in the above first embodiment can be obtained.

Figure 22:
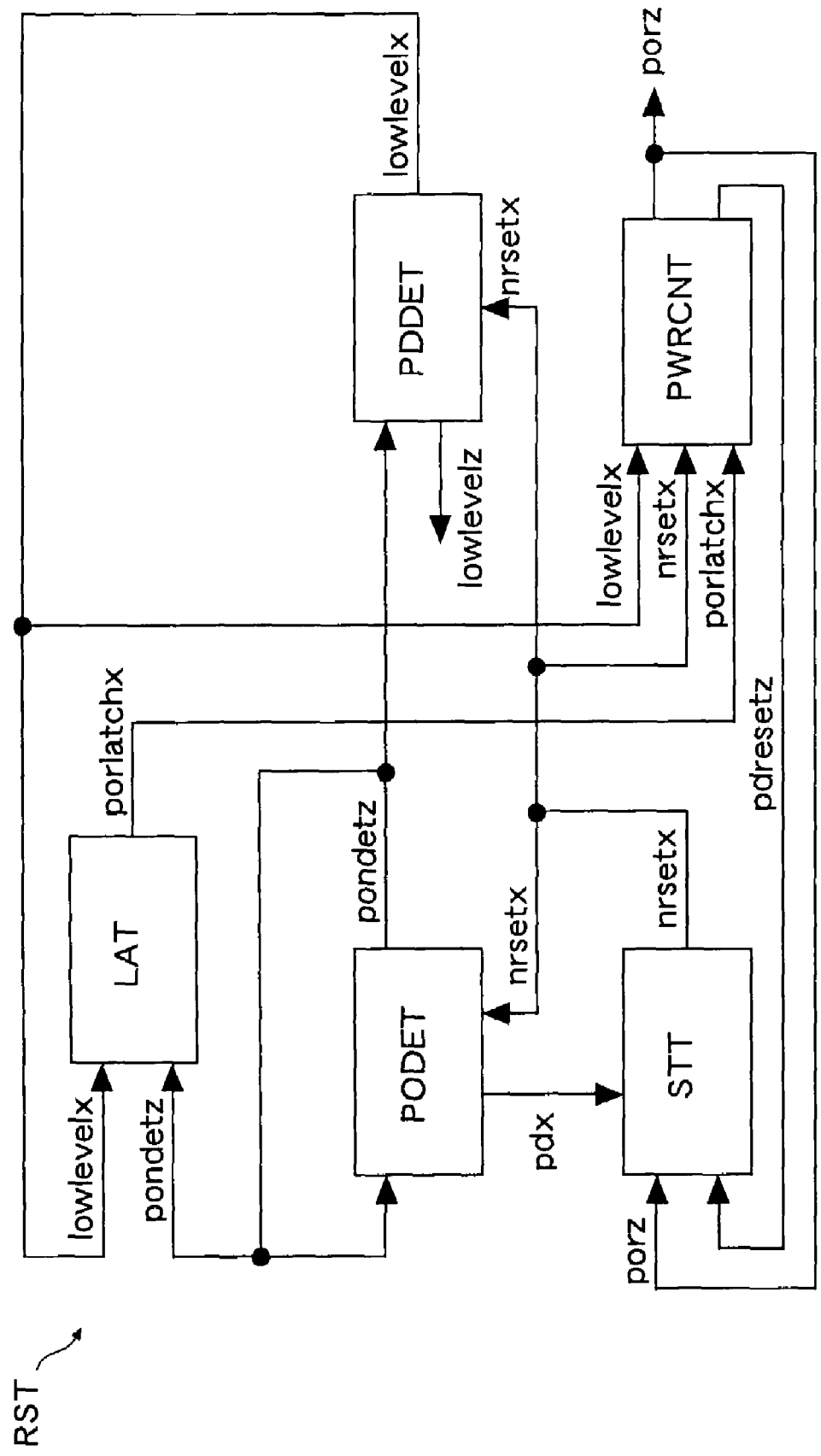
FIG. 22 is a block diagram showing a reset circuit of a tenth embodiment of the present invention.

FIG. 22 shows the reset circuit RST of a tenth embodiment. The same reference symbols are used to designate the same elements as those described in the first embodiment, and a detailed description thereof is omitted. This embodiment differs from the first embodiment in the power-on detection circuit PODET and the starter circuit STT. The other constitutions are the same as in the first embodiment.

The power-on detection circuit PODET, the power-down detection circuit PDDET, the latch circuit LAT, and the power detection control circuit PWRCNT operate as a power detection circuit which activates the power-on signals pondetz, porz indicating a power-on state when the power supply voltage VDD exceeds the first voltage V1 and is initialized during the activation of the initializing signal nrsetx. The same goes for the following embodiments.

Figure 23:
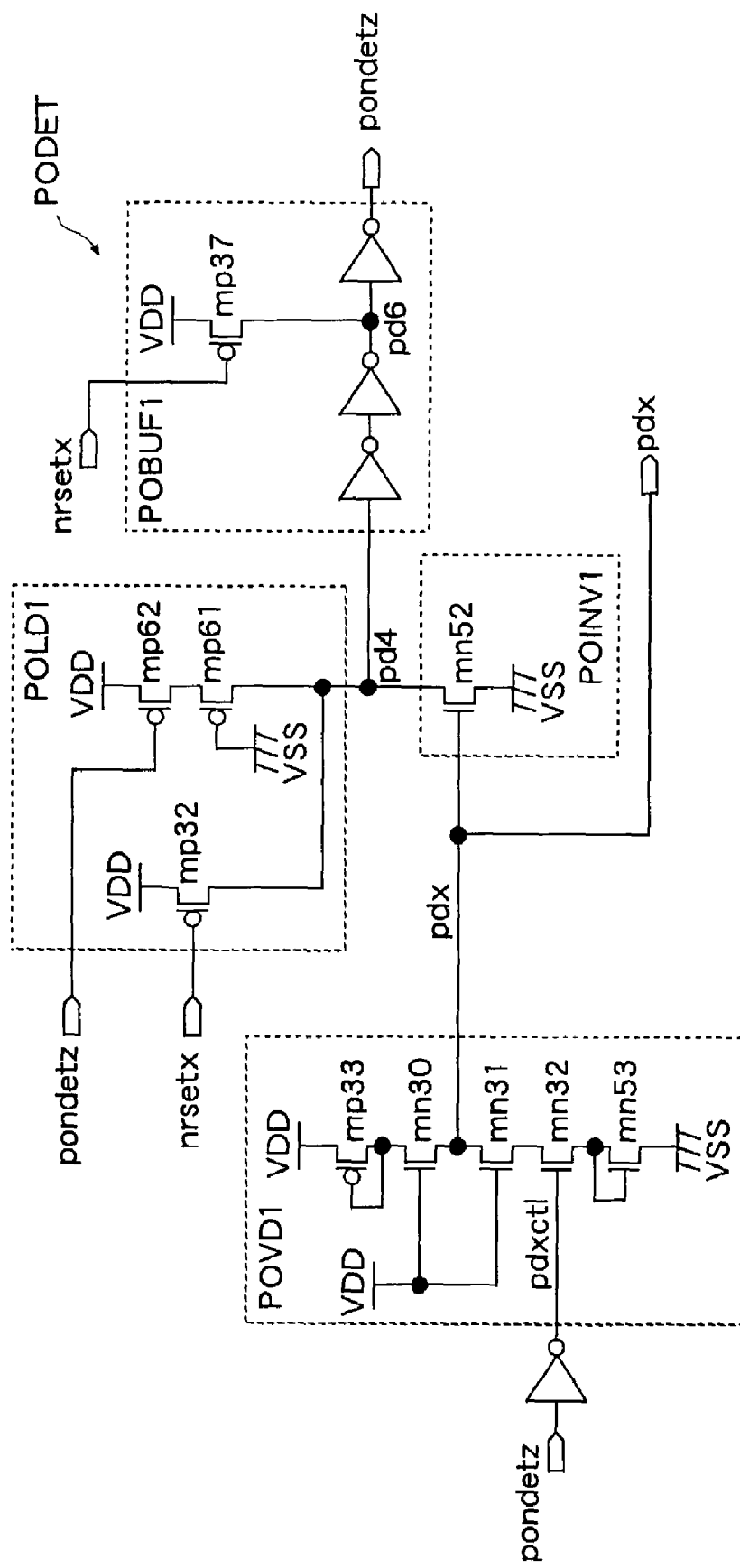
FIG. 23 is a circuit diagram showing a power-on detection circuit in the reset circuit of the tenth embodiment.

FIG. 23 shows details of the power-on detection circuit PODET shown in FIG. 22. The power-on detection circuit PODET is constituted by eliminating the clamping switch SW1 which clamps the node pdx to the ground line VSS from the power-on detection circuit PODET in FIG. 2.

Figure 24:
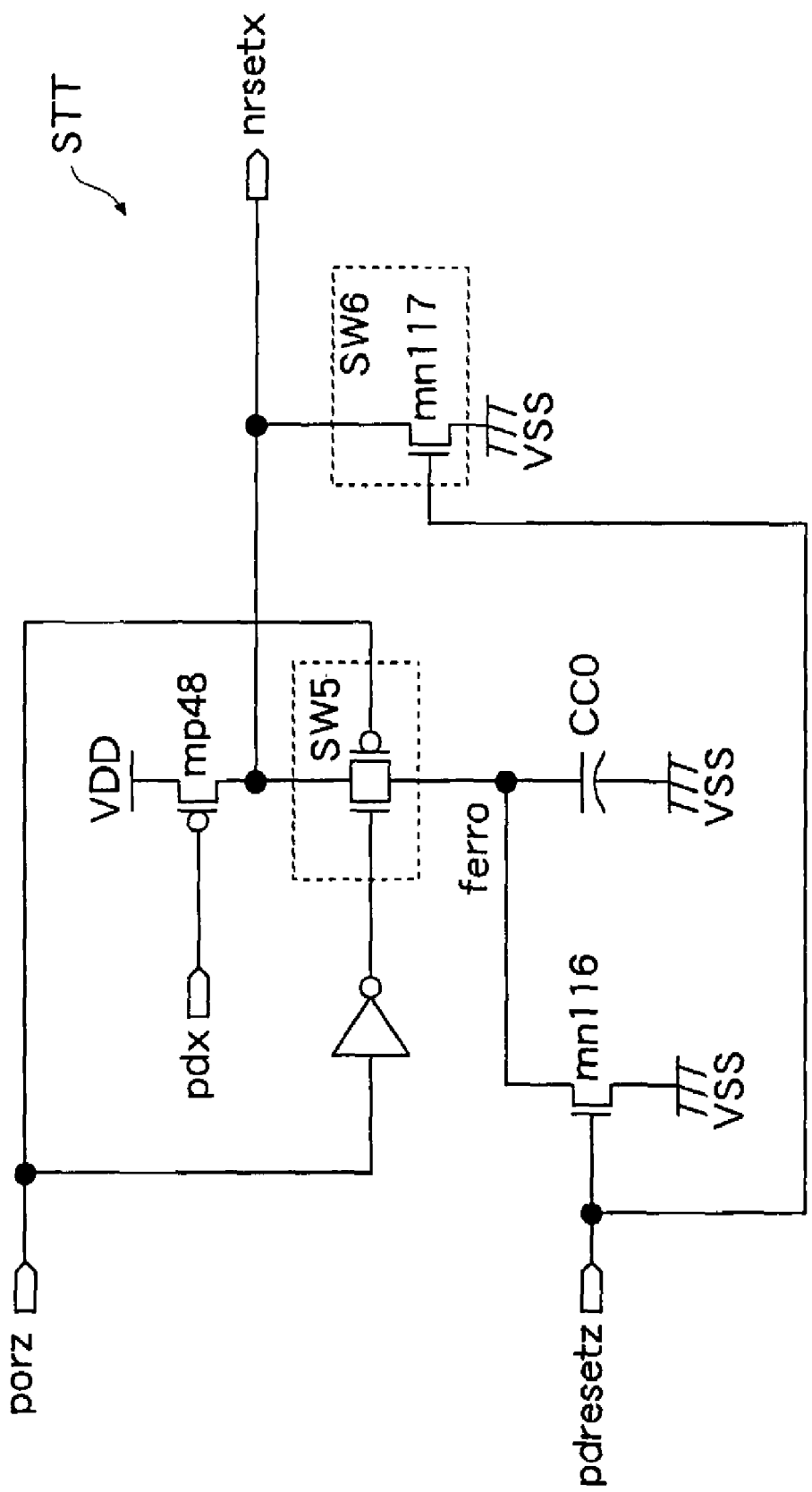
FIG. 24 is a circuit diagram showing a starter circuit in the reset circuit of the tenth embodiment.

FIG. 24 shows details of the starter circuit shown in FIG. 22. The starter circuit STT is constituted by adding a cut-off switch SW5 and a clamping switch SW6 to the starter circuit STT shown in FIG. 4. Namely, the starter circuit STT includes the pMOS transistor mp48, the cut-off switch SW5, and the capacitor CC0 disposed in series between the power supply line VDD and the ground line VSS. The PMOS transistor mp48 receives the voltage pdx being an intermediate voltage between the power supply voltage VDD and the ground voltage VSS at its gate and operates as a resistor element. The capacitor CC0 is, for example, a ferroelectric capacitor formed using a ferroelectric material mainly composed of PZT (lead zirconate titanate). The ferroelectric capacitor has a higher relative dielectric constant than a capacitor formed of an oxide film, so that the element size can be reduced.

The cut-off switch SW5 is constituted of, for example, a CMOS transmission gate, turned on when the reset signal porz from the power detection control circuit PWRCNT is inactivated to a low logic level, and turned off when the reset signal porz is activated to a high logic level. When the switch SW5 is off, a node ferro on the power supply VDD side of the capacitor CC0 is electrically cut off from the power supply line VDD and the charging of the capacitor CC0 is stopped.

The clamping switch SW6 is constituted of a transistor mn117, turned on in response to the activation (high logic level) of the power-down reset signal pdresetz, and sets an output node (first connection node) of the initializing signal nrsetx to the ground voltage VSS. The nMOS transistor mn116 is turned on in response to the activation of the power-down reset signal pdresetz and operates as a clamping switch which connects the node ferro (second connection node) connecting the cut-off switch SW5 and the capacitor CC0 to the ground line VSS. As described in FIG. 5, the power-down reset signal pdresetz is activated in synchronization with the activation of the power-down detection signal lowlevelx at power-down. Namely, the transistors mn116, mn117 are turned on during the activation of the power-down detection signal lowlevelx.

Figure 25:
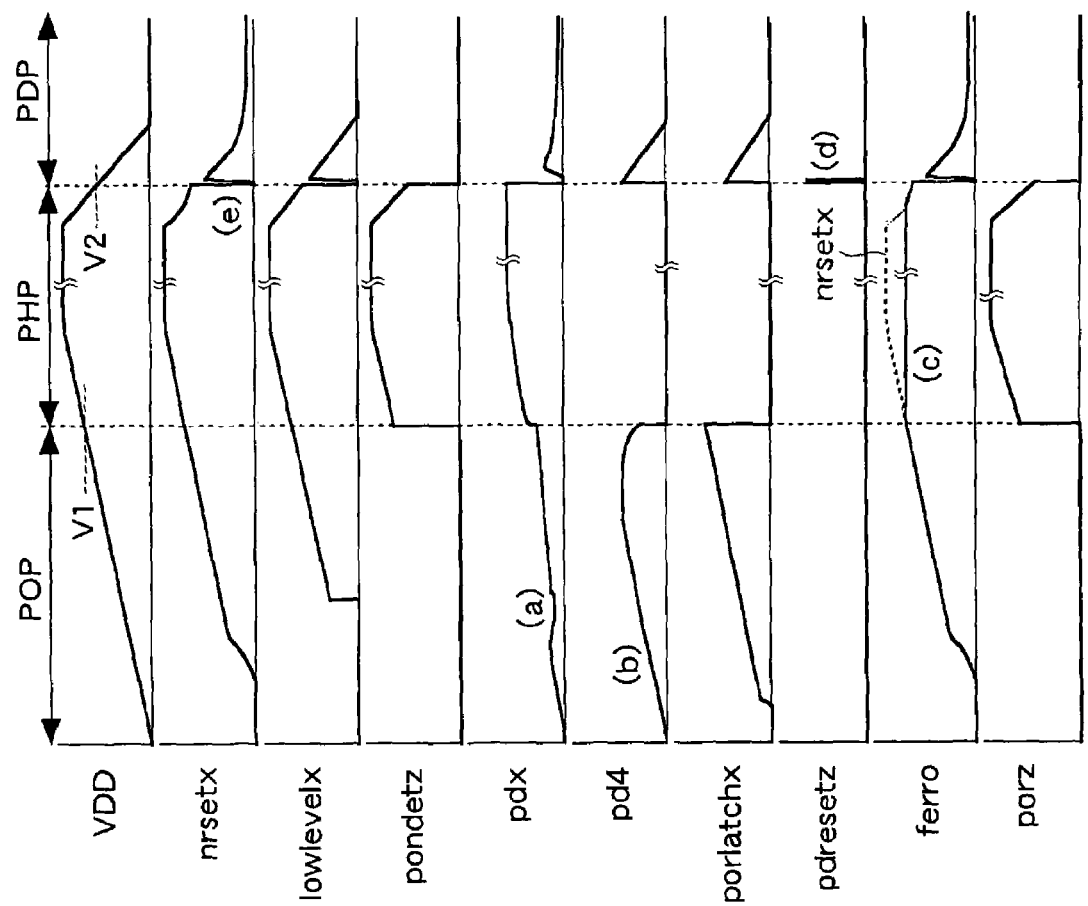
FIG. 25 is a waveform chart showing the operation of the reset circuit of the tenth embodiment.

FIG. 25 shows the operation of the reset circuit RST of the tenth embodiment. Waveforms other than waveforms of the nodes pdx, pd4, and ferro are the same as in FIG. 7. In this embodiment, the clamping switch SW1 shown in FIG. 2 is not formed in the power-on detection circuit PODET. Therefore, in the beginning of the power-on period POP, the voltages of the nodes pdx, pd4 are elevated compared to FIG. 7 (FIG. 25($a, b$)). In the power hold period PHP, the reset signal porz changes to the high level, and the cut-off switch SW5 shown in FIG. 24 is turned off, so that the supply of electric charge to the node ferro via the transistor mp48 is prohibited. Hence, the voltage of the node ferro is maintained at a value corresponding to the rising edge of the reset signal porz (FIG. 25($c$)). Consequently, the voltage applied to the capacitor CC0 during the power hold period PHP can be reduced compared to the voltage of the initializing signal nrsetz which increases following the power supply voltage VDD.

When the power-down reset signal pdresetz is activated at power-down (FIG. 25($d$)), the output node of the initializing signal nrsetx is reset to the ground voltage VSS by the clamping switch SW6 (FIG. 25($e$)). Consequently, even when the cut-off switch SW5 is formed, the initializing signal nrsetx can be certainly reset at power-down.

Generally, a capacitor constituted of a ferroelectric film, an oxide film, or the like sometimes causes a reliability failure due to TDDB degradation. In particular, a ferroelectric capacitor using PZT has a higher coercive voltage Vc than a ferroelectric capacitor using SBT (strontium bismuth tantalat) or the like, so that it is necessary to make the power supply voltage VDD relatively higher. As a result, a saturation voltage V90 increases, and the TDDB degradation becomes liable to occur.

Further, recently, the power supply voltage tends to decrease with the miniaturization of a transistor structure. Along with this, in order to maintain the performance (capacitance value) of the capacitor, the film thickness needs to be reduced. If the film thickness of the capacitor is reduced, the above TDDB degradation tends to occur more frequently. In particular, in the ferroelectric capacitor using PZT with the high coercive voltage Vc and saturation voltage V90, a failure mode due to TDDB becomes dominant, which may becomes a primary factor that shortens the life of a product.

In this embodiment, the voltage applied to the capacitor CC0 during the power hold period PHP can be made lower than the power supply voltage VDD. The power hold period PHP is a period other than the power-on period POP and the power-down period PDP, and a dominant period during which the semiconductor device and the system apparatus are operating. Accordingly, by this embodiment, the degradation of the capacitor CC0 due to TDDB can be prevented, which can prevent the reset circuit RST from malfunctioning. As a result, the semiconductor device in which the reset circuit RST is implemented and the system apparatus can be prevented from malfunctioning.

Further, by lowering the voltage applied to the capacitor CC0 during the power hold period PHP, electric charge stored in the capacitor CC0 can be discharged in a short time at the time of detection of power-down (at the time of the high level of the pdresetz signal). Consequently, even when the power-down is instantaneous and the power supply voltage increases again, the reset circuit RST can operate stably, and power-on can be certainly detected.

Incidentally, the reset circuit RST of this embodiment is formed in the sub system apparatus SSYS shown in FIG. 8 or FIG. 9. The ferroelectric memory FM (semiconductor memory) in the sub system apparatus SSYS includes, for example, a ferroelectric memory cell constituted of a ferroelectric capacitor using PZT. When the ferroelectric memory FM is implemented in a semiconductor chip, a capacitor such as the capacitor CC0 in the semiconductor chip is often constituted of a ferroelectric capacitor in order to prevent the manufacturing process from being complicated. As described above, the ferroelectric capacitor using PZT has a higher coercive voltage, so that the power supply voltage VDD used in the sub system apparatus SSYS is set to a high value. In this embodiment, even when the power supply voltage VDD is high, the voltage applied to the capacitor CC0 can be held down.

As described above, in the tenth embodiment, by cutting off one end of the capacitor CC0 constituting the starter STT from the power supply line VDD during the power hold period PHP, the TDDB degradation of the capacitor CC0 can be prevented. As a result, even when the semiconductor device including the reset circuit RST and the system apparatus are operated for a long period, the reset circuit RST can be operated without malfunctioning, and the reset signal porz can be normally outputted. Namely, the reliabilities of the semiconductor device and the system apparatus can be improved.

By forming the switch SW6 which is turned on during the activation of the power-down detection signal lowlevelx and connects the output node nrsetx to the ground line VSS in the starter circuit STT, the initializing signal nrsetx can be certainly activated to the low level at power-down even when the switch SW5 which cuts off the capacitor CC0 from the output node nrsetx is formed. Namely, when the TDDB degradation of the capacitor CC0 is prevented, the malfunction of the reset circuit RST can be prevented.

Even when the capacitor CC0 is constituted of the ferroelectric capacitor using PZT and the power supply voltage VDD is high, the TDDB degradation can be certainly prevented. In particular, when the ferroelectric memory is mounted in the system apparatus, the capacitor CC0 is constituted of the same element as the ferroelectric capacitor constituting the memory cell in the ferroelectric memory, so that the TDDB degradation can be certainly prevented without the manufacturing process being complicated.

Figure 26:
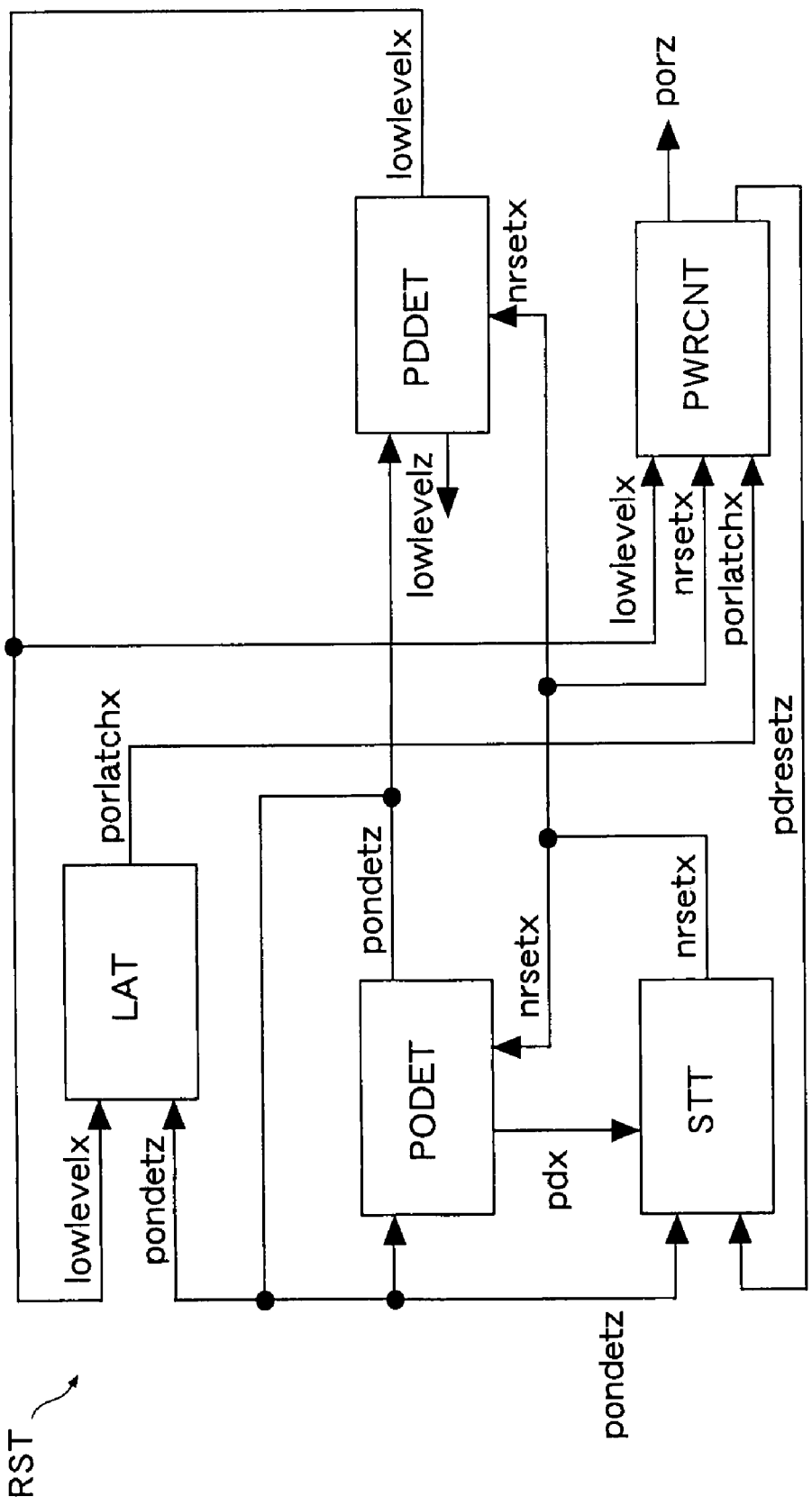
FIG. 26 is a block diagram showing a reset circuit of an eleventh embodiment of the present invention.

FIG. 26 shows the reset circuit RST of an eleventh embodiment. The same reference symbols are used to designate the same elements as those described in the first and tenth embodiments, and a detailed description thereof is omitted. In this embodiment, a signal supplied to the starter circuit STT is changed from the reset signal porz of the tenth embodiment to the power-on detection signal pondetz. The other constitutions are the same as in the tenth embodiment. The reset circuit RST is formed in the sub system apparatus SSYS shown in FIG. 8 or FIG. 9. The ferroelectric memory FM includes the ferroelectric memory cell constituted of the ferroelectric capacitor using PZT.

Figure 27:
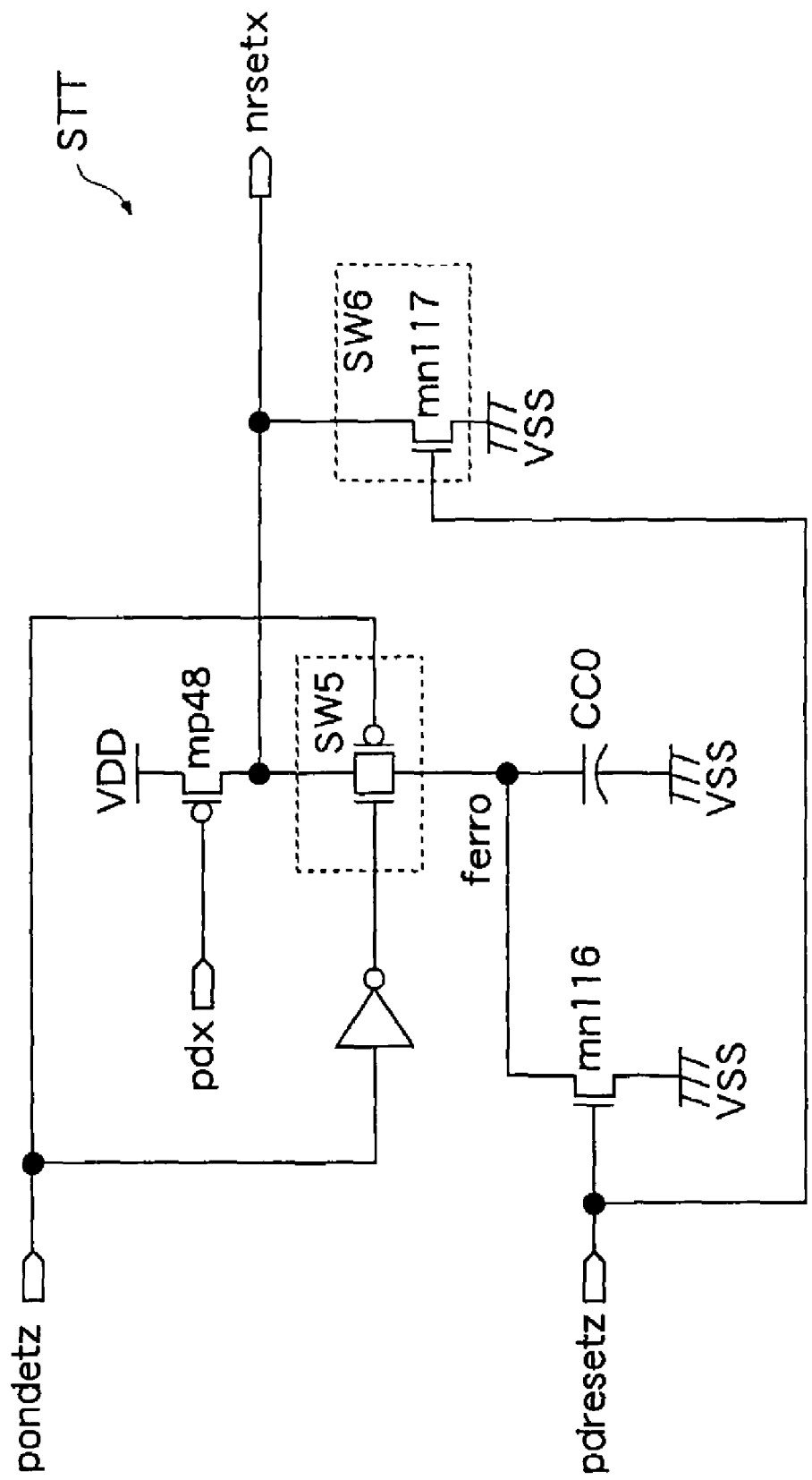
FIG. 27 is a circuit diagram showing a starter circuit in the reset circuit of the eleventh embodiment.

FIG. 27 shows details of the starter circuit STT shown in FIG. 26. In this embodiment, a signal controlling the operation of the cut-off switch SW5 is changed from the reset signal porz to the power-on detection signal pondetz. The other constitutions are the same as in the tenth embodiment (FIG. 24). The power-on detection signal pondetz is an original signal to generate the reset signal porz, and has almost the same waveform as the reset signal porz as shown in FIG. 25. Therefore, the operation of the reset circuit RST of this embodiment is the same as in FIG. 25. As described above, also in the eleventh embodiment, the same effect as in the above tenth embodiment can be obtained.

Figure 28:
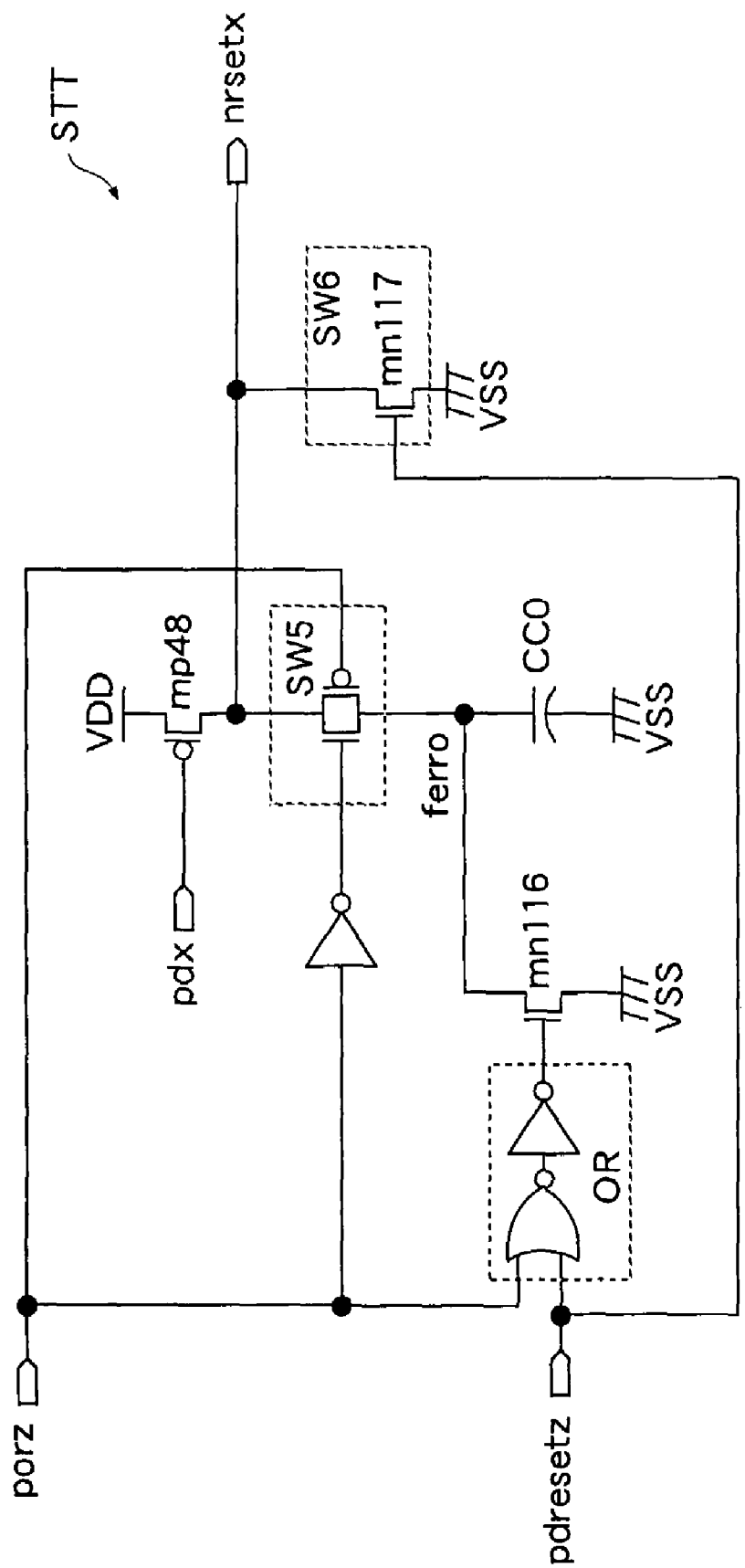
FIG. 28 is a circuit diagram showing a starter circuit in a reset circuit of a twelfth embodiment.

FIG. 28 shows the starter circuit STT in the reset circuit RST of a twelfth embodiment. The same reference symbols are used to designate the same elements as those described in the tenth embodiment, and a detailed description thereof is omitted. Circuits other than the starter circuit STT are the same as in the tenth embodiment. The reset circuit RST is formed in the sub system apparatus SSYS shown in FIG. 8 or FIG. 9. The ferroelectric memory FM includes the ferroelectric memory cell constituted of the ferroelectric capacitor using PZT.

In this embodiment, the transistor mn116 (clamping switch) of the starter circuit STT operates upon receiving a signal of the OR logic of the power-down reset signal pdresetz and the reset signal porz. Namely, the transistor mn116 is turned on when the power-down reset signal pdresetz or the reset signal porz is at the high logic level to connect the node ferro to the ground line VSS.

Figure 29:
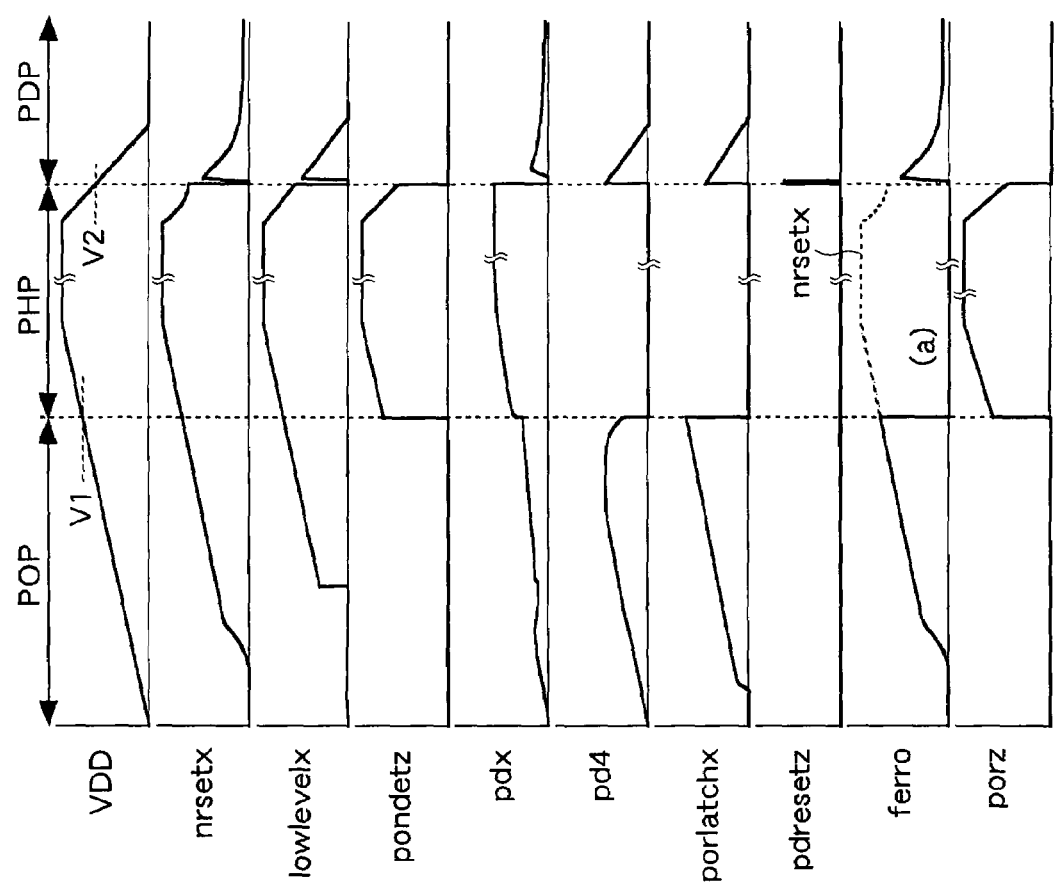
FIG. 29 is a waveform chart showing the operation of the reset circuit of the twelfth embodiment.

FIG. 29 shows the operation of the reset circuit RST of the twelfth embodiment. Waveforms other than the waveform of the node ferro are the same as in FIG. 25. In this embodiment, during the power hold period PHP, electric charge in the capacitor CC0 is discharged, and the voltage of the node ferro is clamped to the ground voltage VSS (FIG. 29(*a*)). Consequently, the voltage applied to the capacitor CC0 during the power hold period PHP becomes 0 V, and the voltage applied to the capacitor CC0 can be maintained at 0 V. Accordingly, the TDDB degradation of the capacitor CC0 can be certainly prevented.

Further, the voltage applied to the capacitor CC0 during the power hold period PHP is 0 V, and hence even when power-down is instantaneous and the power supply voltage increases again, the discharge operation of the capacitor CC0 need not be performed in a short period of time. This can improve the operating margin of the reset circuit RST with respect to the instantaneous power-down.

As described above, also in the twelfth embodiment, the same effect as in the above tenth embodiment can be obtained. Further, in this embodiment, the clamping switch mn116 is turned on not only during the activation of the power-down reset signal pdresetz but also during the activation of the reset signal porz. The activation period of the reset signal porz is a period corresponding to the power hold period PHP being the dominant period during which the semiconductor device and the system apparatus are operating. As a result, the TDDB degradation of the capacitor CC0 can be certainly prevented, which can prevent the semiconductor device in which the reset circuit RST is implemented and the system from malfunctioning.

Figure 30:
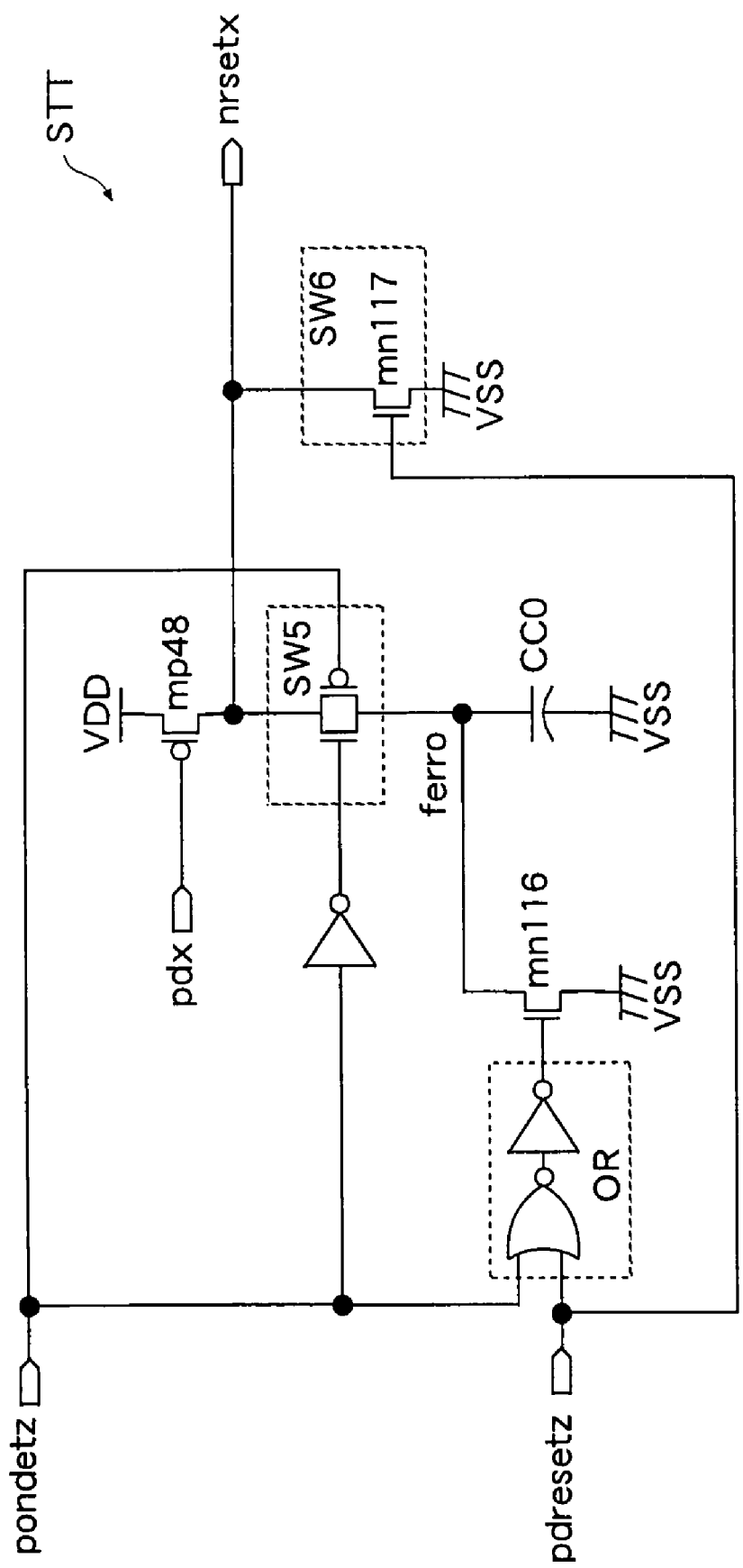
FIG. 30 is a circuit diagram showing a starter circuit in a reset circuit of a thirteenth embodiment.

FIG. 30 shows the starter circuit STT in the reset circuit RST of a thirteenth embodiment. The same reference symbols are used to designate the same elements as those described in the tenth, eleventh, and twelfth embodiments, and a detailed description thereof is omitted. Circuits other than the starter circuit STT are the same as in the eleventh embodiment. The reset circuit RST is formed in the sub system apparatus SSYS shown in FIG. 8 or FIG. 9. The ferroelectric memory FM includes the ferroelectric memory cell constituted of the ferroelectric capacitor using PZT.

In this embodiment, a signal controlling the operations of the cut-off switch SW5 and the transistor mn116 is changed from the reset signal porz to the power-on detection signal pondetz. The other constitutions are the same as in the twelfth embodiment (FIG. 28). The power-on detection signal pondetz is an original signal to generate the reset signal porz, and has almost the same waveform as the reset signal porz as shown in FIG. 29. Therefore, the operation of the reset circuit RST of this embodiment is the same as in FIG. 29. As described above, also in the thirteenth embodiment, the same effect as in the above twelfth embodiment can be obtained.

Figure 31:
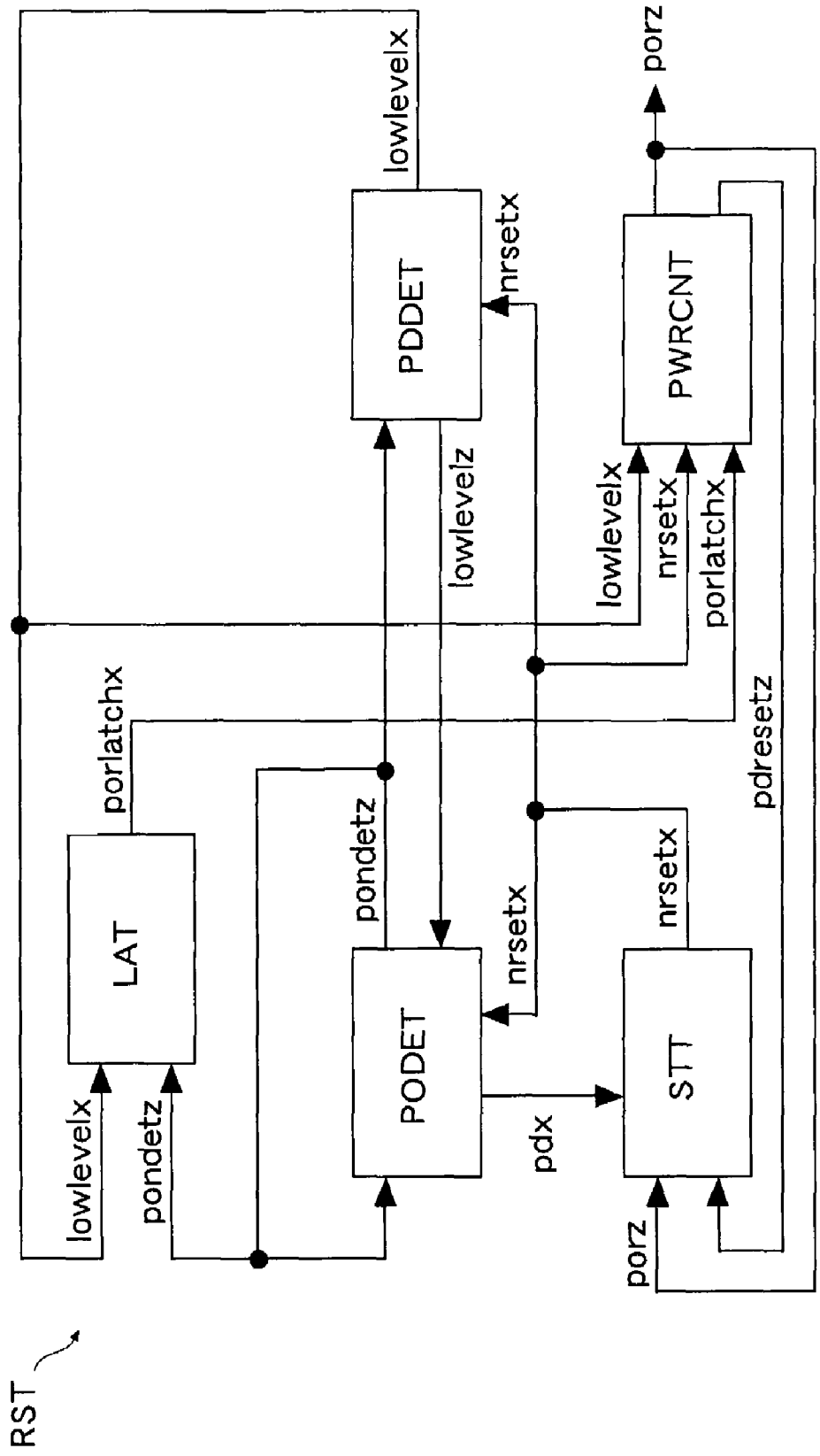
FIG. 31 is a block diagram showing a reset circuit of a fourteenth embodiment of the present invention.

FIG. 31 shows the reset circuit RST of a fourteenth embodiment. The same reference symbols are used to designate the same elements as those described in the first and tenth embodiments, and a detailed description thereof is omitted. In this embodiment, the starter circuit STT of the tenth embodiment is applied to the reset circuit RST of the first embodiment. The other constitutions are the same as in the first embodiment. The reset circuit RST is formed in the sub system apparatus SSYS shown in FIG. 8 or FIG. 9. The ferroelectric memory FM includes the ferroelectric memory cell constituted of the ferroelectric capacitor using PZT.

Figure 32:
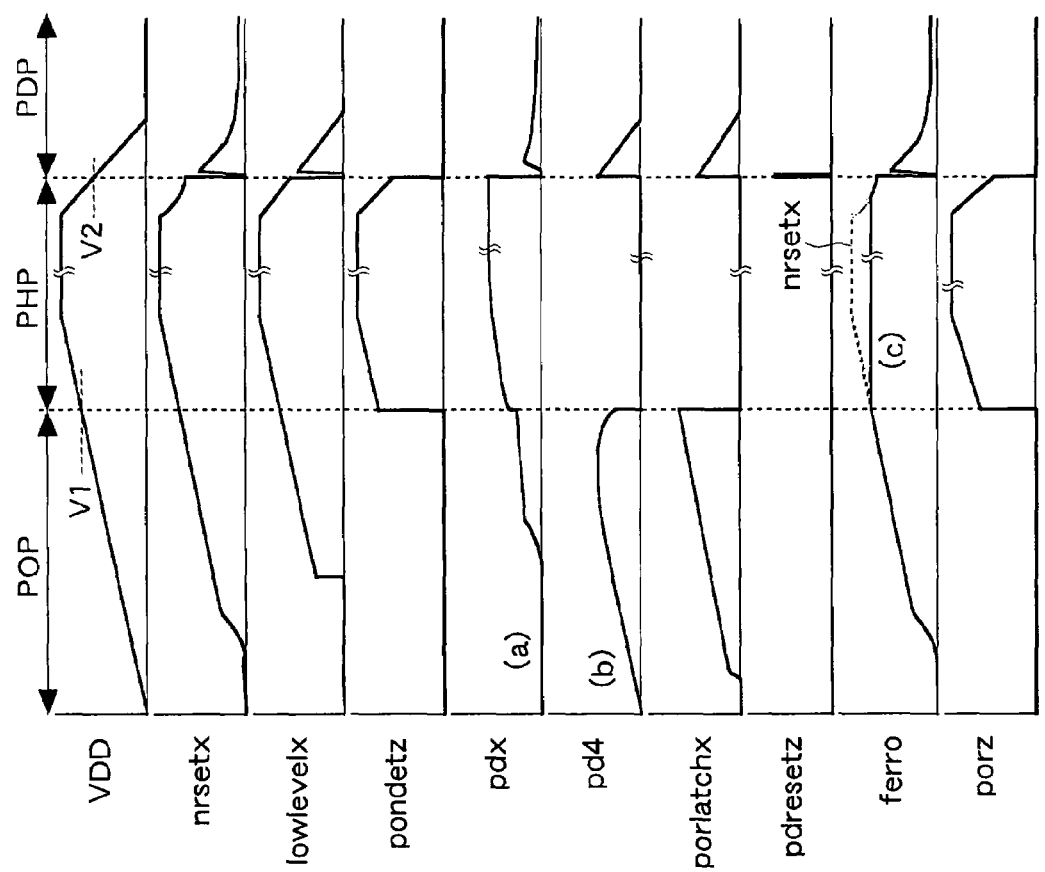
FIG. 32 is a waveform chart showing the operation of the reset circuit of the fourteenth embodiment.

FIG. 32 shows the operation of the reset circuit RST of the fourteenth embodiment. Waveforms other than the waveform of the node ferro are the same as in FIG. 7. The waveform of the node ferro is the same as in FIG. 25. Incidentally, the starter circuits STT of the eleventh, twelfth, and thirteenth embodiments may be applied to the reset circuit RST of the first embodiment. As described above, also in the fourteenth embodiment, the same effects as in the above first and tenth embodiments can be obtained.

Incidentally, in the above embodiments, the example in which the main system apparatus MSYS and the sub system apparatus SSYS are connected directly via the external terminals is described. The present invention is not limited to these embodiments. For example, when the main system apparatus MSYS is a reader/writer and the sub system apparatus SSYS is an RFID (Radio Frequency IDentification) accessed by the reader/writer, the sub system apparatus SSYS is connected to the main system apparatus MSYS by a contactless interface. In this case, the sub system apparatus SSYS obtains the power supply voltage VDD by converting magnetic energy released from the reader/writer into electric energy.

By combining the above sixth and eighth embodiments, the subthreshold current flowing through the memory cell array and the circuit operating in the analog manner formed in the semiconductor device or the like can be measured accurately during the test mode. Alternatively, by combining the seventh and eighth embodiments, the subthreshold current or the like can be measured accurately during the test mode.

Further, the characteristic of the above ninth embodiment may be applied to the second to eighths embodiments. The transistors mn116, mn117 of the starter circuit STT may be COMS transmission gates. In this case, a gate of a pMOS transistor of the CMOS transmission gate receives an inversion signal of a signal supplied to a gate of an nMOS transistor of the CMOS transmission transistor.

In the above tenth to fourteenth embodiments, the example in which the capacitor CC0 of the starter circuit STT is constituted of the ferroelectric capacitor using PZT is described. The present invention is not limited to these embodiments. For example, the capacitor CC0 may be constituted using a ferroelectric capacitor using SBT, any another ferroelectric material, or silicon dioxide.

In the above tenth to fourteenth embodiments, the example in which the present invention is applied to the starter circuit STT of the reset circuit RST including the power-on detection circuit PODET and the power-down detection circuit PDDET is described. The present invention is not limited to these embodiments. For example, the present invention may be applied to a starter circuit of a reset circuit including only the power-on detection circuit which detects power-on.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A reset circuit comprising:
  a power-on detection circuit which activates a power-on detection signal when a power supply voltage exceeds a first voltage;
  a power-down detection circuit which activates a power-down detection signal when the power supply voltage becomes lower than a second voltage lower than said first voltage, and
  a power detection control circuit which activates a reset signal in response to the activation of the power-on detection signal and inactivates said reset signal in response to the activation of the power-down detection signal, wherein
  said power-on detection circuit includes:
  a first dividing circuit which includes at least two first resistor elements disposed in series between a first power supply line and a second power supply line and generates a first divided voltage at a first connection node connecting the first resistor elements to each other;
  a first transistor which receives said first divided voltage at its gate and whose source is connected to the second power supply line;

a clamping switch which is disposed between the gate of said first transistor and said second power supply line and turned on during the activation of said power-down detection signal;

a first load circuit which includes a resistor element disposed between said first power supply line and a first output node in order to charge the first output node connected to a drain of said first transistor; and a first buffer circuit which shapes a voltage waveform of said first output node and outputs it as said power-on detection signal, and wherein said power-down detection circuit includes:

a second dividing circuit which includes at least two second resistor elements disposed in series between the first power supply line and the second power supply line and a connection switch disconnecting said second resistor elements and said second power supply line during inactivation of said power-on detection signal and generates a second divided voltage at a second connection node connecting the second resistor elements to each other;

a second transistor which receives said second divided voltage at its gate and whose source is connected to the second power supply line;

a second load circuit which includes a resistor element disposed between said first power supply line and a second output node in order to charge the second output node connected to a drain of said second transistor; and a second buffer circuit which shapes a voltage waveform of said second output node and outputs it as said power-down detection signal.

2. The reset circuit according to claim 1, further comprising a leak prevention switch which is disposed between said first connection node and the gate of said first transistor and turned off during the activation of said power-down detection signal.

3. The reset circuit according to claim 1, wherein said first dividing circuit further includes a leak prevention switch disposed between said first power supply line and said first resistor elements and turned off during the activation of said power-down detection signal.

4. The reset circuit according to claim 3, wherein said leak prevention switch is turned off during the activation of said power-down detection signal or during activation of a test signal activated in a test mode.

5. The reset circuit according to claim 1, wherein the first resistor element disposed on said first power supply line side from said first connection node out of said first resistor elements is constituted of a transistor, and in order to be turned off during the activation of said power-down detection signal, receives a control signal generated from said power-down detection signal at a gate of the transistor.

6. The reset circuit according to claim 5, wherein the transistor constituting said first resistor element is turned off during the activation of said power-down detection signal or during activation of a test signal activated in a test mode.

7. The reset circuit according to claim 1, wherein said first dividing circuit further includes:

a third transistor which is disposed between said first power supply line and said first resistor elements and whose source is connected to said first power supply line and drain is connected to one of said first resistor elements;

a connection switch which connects a gate and the drain of said third transistor to each other during inactivation of said power-down detection signal and disconnects the gate and the drain of said third transistor during the activation of said power-down detection signal; and a voltage control switch which supplies a voltage to turn off said third transistor to the gate of said third transistor during the activation of said power-down detection signal.

8. The reset circuit according to claim 1, wherein said first dividing circuit further includes a connection switch which disconnects said first connection node and said second power supply line during the activation of said power-on detection signal, said first load circuit further includes a connection switch which releases a connection between said first power supply line and said first output node during the activation of said power-on detection signal, and said second load circuit further includes a connection switch which disconnects said first power supply line and said second output node during the inactivation of said power-on detection signal.

9. The reset circuit according to claim 8, wherein said connection switches of said second dividing circuit and said second load circuit are turned off during the inactivation of said power-on detection signal or during activation of a test signal activated in a test mode.

10. The reset circuit according to claim 1, further comprising:

a starter circuit which activates an initializing signal at a start of supply of the power supply voltage and inactivates the initializing signal before said power-down detection signal is activated; wherein said power-down detection circuit further includes a clamping circuit to activate said power-down detection signal during the activation of said initializing signal.

11. The reset circuit according to claim 1, further comprising:

a starter circuit which includes a resistor element, a cut-off switch, and a capacitor disposed in series between said first power supply line and said second power supply line, and outputs a initializing signal to initialize said power-on detection circuit, said power-down detection circuit, and said power detection control circuit from a first connection node connecting the resistor element and said cut-off switch, wherein said cut-off switch is turned off during the activation of either said power-on detection signal or said reset signal.

12. A system including a reset circuit comprising:

a power-on detection circuit which activates a power-on detection signal when a power supply voltage exceeds a first voltage;

a power-down detection circuit which activates a power-down detection signal when the power supply voltage becomes lower than a second voltage lower than said first voltage, and a power detection control circuit which activates a reset signal in response to the activation of the power-on detection signal and inactivates said reset signal in response to the activation of the power-down detection signal, and wherein said reset circuit is implemented in any of semiconductor devices constituting the system, wherein said power-on detection circuit includes:

a first dividing circuit which includes at least two first resistor elements disposed in series between a first power supply line and a second power supply line and generates a first divided voltage at a first connection node connecting the first resistor elements to each other;

a first transistor which receives said first divided voltage at its gate and whose source is connected to the second power supply line;

a clamping switch which is disposed between the gate of said first transistor and said second power supply line and turned on during the activation of said power-down detection signal;

a first load circuit which includes a resistor element disposed between said first power supply line and a first output node in order to charge the first output node connected to a drain of said first transistor; and a first buffer circuit which shapes a voltage waveform of said first output node and outputs it as said power-on detection signal, and wherein said power-down detection circuit includes:

a second dividing circuit which includes at least two second resistor elements disposed in series between the first power supply line and the second power supply line and a connection switch disconnecting said second resistor elements and said second power supply line during inactivation of said power-on detection signal and generates a second divided voltage at a second connection node connecting the second resistor elements to each other;

a second transistor which receives said second divided voltage at its gate and whose source is connected to the second power supply line;

a second load circuit which includes a resistor element disposed between said first power supply line and a second output node in order to charge the second output node connected to a drain of said second transistor; and a second buffer circuit which shapes a voltage waveform of said second output node and outputs it as said power-down detection signal.

13. The system including the reset circuit according to claim 12, further comprising:

a main system apparatus, and a sub system apparatus which is detachably connected to the main system apparatus and to which a power supply is supplied from the main system apparatus, and wherein said reset circuit is implemented in any of semiconductor devices constituting said sub system apparatus.

* * * * *